United States Patent
Koike et al.

(10) Patent No.: US 8,531,033 B2
(45) Date of Patent: Sep. 10, 2013

(54) CONTACT PLUG STRUCTURE, SEMICONDUCTOR DEVICE, AND METHOD FOR FORMING CONTACT PLUG

(75) Inventors: Junichi Koike, Sendai (JP); Akihiro Shibatomi, Sendai (JP); Kouji Neishi, Sendai (JP)

(73) Assignee: Advanced Interconnect Materials, LLC, Miyagi (JP)

( * ) Notice: Subject to any disclaimer, the term of this patent is extended or adjusted under 35 U.S.C. 154(b) by 45 days.

(21) Appl. No.: 12/807,528

(22) Filed: Sep. 7, 2010

(65) Prior Publication Data

US 2011/0057317 A1     Mar. 10, 2011

(30) Foreign Application Priority Data

Sep. 7, 2009 (JP) .................. 2009-205748
Feb. 16, 2010 (JP) .................. 2010-030976

(51) Int. Cl.
H01L 23/498 (2006.01)
H01L 21/768 (2006.01)

(52) U.S. Cl.
USPC 257/751; 438/653; 257/E23.06; 257/E21.586

(58) Field of Classification Search
USPC ............ 257/751, E23.06, E21.586; 438/653, 438/655
See application file for complete search history.

(56) References Cited

U.S. PATENT DOCUMENTS 7,470,612 B2 * 12/2008 Choi et al. .................. 438/627
7,507,666 B2   3/2009 Nakao et al.
2009/0283910 A1 * 11/2009 Hinomura .................. 257/751
2010/0320604 A1 * 12/2010 Isobayashi .................. 257/751
2011/0049718 A1 *  3/2011 Matsumoto et al. ......... 257/751

FOREIGN PATENT DOCUMENTS

| JP | H01-202841 | 8/1989 |
| JP | H08-245275 | 9/1996 |
| JP | 2007-059660 | 3/2007 |
| JP | 2007-141927 | 6/2007 |
| JP | 2007-142236 | 6/2007 |
| JP | 2007-287816 | 11/2007 |
| JP | 2008-047578 | 2/2008 |
| JP | 2008-047719 | 2/2008 |
| JP | 2008-060431 | 3/2008 |
| JP | 2008-066428 | 3/2008 |
| JP | 2008-071850 | 3/2008 |
| JP | 2008-117853 | 5/2008 |
| JP | 2008-153472 | 7/2008 |

(Continued)

OTHER PUBLICATIONS

K. Neishi et al, "Cu diffusion barrier and electrical properties of Cu direct contact structure of LSI with CVD-MnOx barrier layer", The Japan Society of Applied Physics No. 2, The 70th Autumn Meeting 2009, Sep. 8, 2009, pp. 762 10p-TB-23.

(Continued)

*Primary Examiner* — Calvin Lee
*Assistant Examiner* — Monica D Harrison
(74) *Attorney, Agent, or Firm* — Sughrue Mion, PLLC

(57) ABSTRACT

A contact plug structure formed on a contact hole of an insulating layer of a semiconductor device includes a metal silicide layer formed on a bottom part of the contact hole of the insulating layer, a manganese oxide layer formed on the metal silicide layer in the contact hole, and a buried copper formed on the manganese oxide layer which substantially fills the contact hole.

30 Claims, 19 Drawing Sheets

(56) References Cited

FOREIGN PATENT DOCUMENTS

| | | |
|---|---|---|
| JP | 2009-004654 | 1/2009 |
| JP | 2009-010037 | 1/2009 |
| JP | 2009-054646 | 3/2009 |
| JP | 2009-076881 | 4/2009 |
| JP | 2009-094274 | 4/2009 |
| JP | 2009-164471 | 7/2009 |
| JP | 2009-200256 | 9/2009 |
| JP | 2010-040772 | 2/2010 |
| JP | 2010-050360 | 3/2010 |
| JP | 2010-073736 | 4/2010 |
| JP | 2010-080606 | 4/2010 |
| JP | 2010-080607 | 4/2010 |

OTHER PUBLICATIONS

K.Neishi et al, "Thin MnO Barrier Formation with CVD for Copper Contact Plug on Nickel Silicide", Advanced Metallization Conference (AMC) 2009, Oct. 13-15, 2009, pp. 3-4.

S.M.Sze, "Semiconductor device—Physics and Technology 2nd edition" Oct. 5, 2005, pp. 355-356.

J.A.Poate et al, "Thin Films-Interdiffusion and Reactions", John Wiley & Sonsm Inc., USA, 1978, pp. 360-363.

Kenji Matsumoto et al, "Chemical Vapor Depositon of Mn and Mn Oxide and their Step Coverrage and Diffusion Barrier Properties on Patterned Interconnect Structures", Appl. Phys. Express. 2009, No. 036503, 036503-1-036503-2.

K.Neishi et al, "Formation of manganese oxide barrier layer with thermal chemical deposition for advanced large-scale integrated interconnect structure", Appl. Phys. Lett. 2008, 032106.

R.Islam et al., VLSI Proc., pp. 22-23 (2000) "A 0.20 μm CMOS Technology with copper-filled Contact and Lacal Interconnect".

M.Inohara et al., IEDM Proc., pp. 4.6. 1-3(2001) "Copper Filling Contact Process to Realize Low Resistance and Low Cost Production fully compatible to SOC devices".

S.Demuynck et al., IITC Proc., pp. 178-179(2006) "Impact of Cu contacts on front-end performance: a projection towards 22 nm node".

Tsuda et al.; Electroconductive Oxide (Revised Edition); 4th edition published on Oct. 15, 1993; pp. 26 and 30; Publisher: Kabushiki Kaisha Shokabo (Japan).

Tsuda et al.; Electronic Conduction in Oxides; Second, Revised and Enlarged Edition, 2010, pp. 29-30, Springer-Verlag (Germany).

* cited by examiner

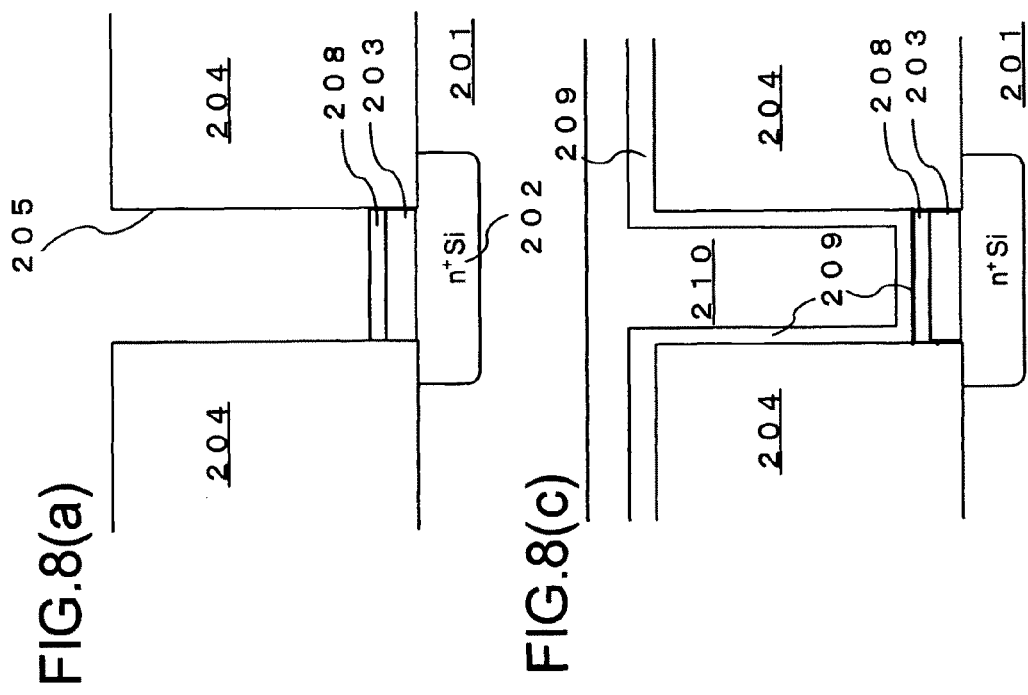

CONTACT PLUG STRUCTURE, SEMICONDUCTOR DEVICE, AND METHOD FOR FORMING CONTACT PLUG

This application claims priority under 35 U.S.C. §119 from Japanese patent application serial No. 2009-205748, filed Sep. 7, 2009, entitled "Contact plug, interconnection, semiconductor device, and method for forming contact plug," and Japanese patent application serial No. 2010-30976, filed Feb. 26, 2010, entitled "Contact plug, interconnection, semiconductor device, and method for forming contact plug," which are incorporated herein by reference in its entirety.

TECHNICAL FIELD

The present invention is related to a contact plug structure formed at a contact hole of an insulating layer of a semiconductor device, a semiconductor device and a method for forming the contact plug.

BACKGROUND OF THE INVENTION

Recently, in the domain of ultra LSI silicon semiconductor devices, with the increase of integration density of semiconductor elements such as transistors and the reduction of chip size, geometric dimensions of the integrated semiconductor elements and internal interconnections of integrated circuits for electrically connecting those elements are consistently being miniaturized. The interconnection used in the silicon semiconductor devices is not limited to planar and two-dimensional interconnection. For example, in integrated circuits such as an ultra LSI, three-dimensional interconnections are utilized. Moreover, a damascene type structure (refer to the following non-patent document 1) using buried interconnections is also utilized. A contact plug is the one that is used for electrically connecting these interconnections and the transistor elements constituting the integrated circuits.

A contact plug formed in a contact hole (an opening to form the contact plug) that constitutes a part of an interconnection for silicon semiconductor integrated circuits is used for providing electric signals through an electrode made of metal silicide, etc., that is provided in an active region which realizes functions of a transistor constituting the integrated circuits. Here, the active region is a region where impurities are added in order to exert a function of a transistor element or an ion-implanted region. A source or a drain region is the example of the active region of a silicon transistor. A source or a drain region made of an amorphous silicon (a-Si) is also the example of the active region of a thin film transistor (TFT). At the active region, a transistor is generally formed with an electrode including a metal silicide layer (refer to "THIN FILMS-INTERDIFFUSION AND REACTIONS" by J. A. POATE, K. N. TU, and J. W. MAYER (Edi.) (John Wiley & Sons, Inc., USA, 1978 (ISBN 0-471-02238-1), pp 360-363)).

In a conventional technology, there is an example (refer to Japanese patent laid-open publication No. 2008-117853) where the contact plug of every electrode of the source, drain and gate of the transistor is made of tungsten (element symbol: W). The contact plug composed from tungsten (W) is electrically connected to a low-electrical-resistance interconnection made of aluminum (element symbol: Al) or copper (Cu).

Corresponding to the refinement of the contact hole based on high integration of the present silicon semiconductor integrated circuits, the contact plug that is provided at the active region made of silicon or the electrode made of metal silicide becomes even more refined. As a result, the present condition is that increase in electrical resistance of contact plug cannot be ignored, which adversely affects the signal delay (RC delay), and thus it has led to a problem in high speed processing of electrical signals. Therefore, a technology is proposed where the contact plug is formed using copper (Cu), which has lower specific resistance than tungsten (W) (refer to Japanese patent laid-open publication No. 2008-117853 and Japanese patent laid-open publication No. 2009-010037, and also refer to R. Islam et al., VLSI Proc., pp. 22-23 (2000), M. Inohara et al. IEDM Proc., pp. 4.6. 1-3 (2001), S. Demuynck et al., IITC Proc., pp. 178-179 (2006). Incidentally, it is said that the specific resistance of pure copper is 1.66 micro-ohm centimeter ($\mu\Omega\cdot cm$) (refer to Japanese patent laid-open publication No. H01-202841).

Japanese patent laid-open publication No. 2008-117853 discloses a technology where a contact plug that is composed of a layered structure of a tungsten (W) layer and a copper (Cu) layer on the tungsten (W) layer is configured at a source and a drain region of a transistor. In this layered structure, it is described that tungsten (W) fulfills a function as a so-called diffusion barrier layer, which deters atom diffusion of copper (Cu) into the source or drain region. Moreover, it is described that if the film thickness of the tungsten (W) that constitutes the layered structure is set to be one third of the depth of the contact hole at which the contact plug is provided or around 50 nanometers (Unit: nm), it can contribute to reduction of the electrical resistance of the contact plug.

However, even if the contact plug is composed of the layered structure of tungsten (W) and copper (Cu) following the conventional technology, it does not sufficiently stably lead to a contact plug with low contact resistance because tungsten (W) with large specific resistance exists internally in the contact plug. Moreover, it has not sufficiently stably achieved a plug with low electrical resistance as compared to the case of a contact plug composed completely of copper (Cu). Therefore, the current situation is that sufficiently stable production of system LSI that requires a transistor with low RC delay (refer to pages 345-346 of "Semiconductor Device (2nd edition)—Physics and Technology" by S. M. Sze (Oct. 5, 2005, Sangyo Tosho, Co., Ltd., third impression of second edition, pp 345-346)) and with high speed operation as a compositional element has not been achieved. Further, in the current situation, it is true that the magnitude of electrical resistance of a contact plug proves to be an obstacle for the supply of silicon integrated circuits with low power consumption.

Besides, "THIN FILMS-INTERDIFFUSION AND REACTIONS" by J. A. POATE, K. N. TU, and J. W. MAYER (Edi.) (John Wiley & Sons, Inc., USA, 1978 (ISBN 0-471-02238-1), pp 360-363) discloses the technology where the contact plug consists only of copper (Cu). As a diffusion barrier layer to prevent atomic diffusion of copper (Cu) in the contact plug consisting only of copper (Cu), a double layer structure is used where the first layer (lower layer) is tantalum (element symbol: Ta) or titanium (element symbol: Ti) and the second layer (upper layer: layer that contacts the copper (Cu) of the plug) is tantalum nitride (TaN) or titanium nitride (TiN).

In this way, in a case where the contact plug is formed only of copper (Cu), if the diffusion barrier layer of the double layer structure of the conventional technology is used, it will cause further inconvenience. This is because, whereas it is advisable to use a thin diffusion barrier layer to obtain a contact plug with low contact resistance, there are technical difficulties in having a thin layer, because the diffusion barrier layer composition revealed by the conventional technology requires two layers. In addition, problems have been found in providing the diffusion barrier layer of the double structure with a uniform film thickness especially in the refined contact hole with a small aspect ratio (a ratio of the width of the opening against the depth of the contact hole) and especially over the entire surface of the metal silicide exposed in the deep bottom.

Incidentally, another problem in the case where the contact hole is constituted from copper (Cu) is that copper (Cu) shows high reactivity to silicon or metal silicide exposed at the bottom surface of the contact hole in which the contact plug is formed, and moreover, the diffusion rate of copper atoms is also high. Therefore, even if a very thin diffusion barrier layer is used, if diffusion of copper (Cu) atoms cannot sufficiently be prevented, it causes problems of deterioration of ohmic characteristics or schottky characteristics of an electrode that constitutes the transistor because of the reaction of the copper (Cu) and the metal silicide, etc., for example. Accordingly, in the case of manufacturing an integrated circuit by integrating transistors of low performance by high density, if there are defects in the transistor elements forming that integrated circuit, it is expected that there will be problems to obtain an integrated circuit with normal characteristics.

Moreover, for example, even if a contact plug made of copper (Cu) is formed on a very thin barrier layer that is insufficient to prevent atom diffusion of copper (Cu) on a metal silicide layer of a source region or a drain region of a transistor, there is a problem that drain current leak is easy to occur due to the penetrating copper (Cu) atoms. Moreover, for example, even if a contact plug made of copper (Cu) is formed on a very thin barrier layer that is insufficient to prevent atom diffusion of copper (Cu) on a metal silicide layer formed at a gate region, there are problems that a gate current leak occurs and getting normal pinch-off characteristics is difficult, and so on, due to the penetrating copper (Cu) atoms. Moreover, a technique where a copper interconnection is configured with a manganese oxide (MnO) layer as a diffusion barrier layer against copper is disclosed (refer to "Chemical Vapor Deposition of Mn and Mn Oxide and their Step Coverage and Diffusion Barrier Properties on Patterned Interconnect Structures" by Kenji Matsumoto, Koji Neishi, Hitoshi Itoh, Hiroshi Sato, Shigetoshi Hosaka, and Junichi Koike (Applied Physics Express, Volume 2, 2009, published by the Japan Society of Applied Physics, Paper no. 036503, pp. 036513-1 to 036503-2) "Formation of manganese oxide barrier layer with thermal chemical deposition for advanced large-scale integrated interconnect structure" by K. Neishi, S. Aki, K. Matsumoto, H. Sato, H. Itoh, S. Hosaka, and J. Koike (Applied Physics Letters, Volume 93, 2008, published by American Institute of Physics, USA, Paper no. 032106)).

This invention is developed to overcome the above mentioned problems of the conventional technology. An objective of this invention is to provide a contact plug, a semiconductor device and a method for forming the contact plug. Here, the contact plug is able to stably suppress the diffusion of copper (Cu) atoms to a metal silicide film. Further, the contact plug is made from copper (Cu), which has low specific resistance that leads to low contact resistance.

SUMMARY OF THE INVENTION

In accordance with one aspect of the present invention, a contact plug structure, formed on a contact hole of an insulating layer of a semiconductor device, includes:
a metal silicide layer formed on a bottom part of the contact hole;
a manganese oxide layer formed on the metal silicide layer in the contact hole; and
a buried copper formed on the manganese oxide layer, the buried copper substantially filling the contact hole.

According to the first aspect of the present invention, as described above, it is configured that the contact plug formed of copper (Cu) is provided on the manganese oxide layer formed on the surface of the metal silicide layer in the contact hole which is provided in the insulating layer and of which the metal silicide layer is located at the bottom part. In other words, it is configured that the contact plug is formed on the manganese oxide layer, which can sufficiently exert an effect of suppressing copper atom diffusion even if it is thin. Therefore, it is possible to provide a contact plug made of copper (Cu) that does not adversely affect, for example, the source or drain characteristics of transistors. Moreover, even if the diffusion barrier layer of the double layer structure according to the conventional technology is not used, it is possible to provide a copper (Cu) contact plug with low contact resistance.

In accordance with a second aspect of the present invention, a method for forming a contact plug at a contact hole of an insulating layer in a semiconductor device includes the steps of:
forming a metal silicide layer on a bottom surface of the contact hole of the insulating layer;
forming a manganese oxide layer on the metal silicide layer; and
forming a buried copper on the manganese oxide layer.

According to the second aspect of the present invention, as described above, it is configured that the contact plug formed of copper (Cu) is provided on the manganese oxide layer formed on the surface of the metal silicide layer in the contact hole which is provided in the insulating layer and of which the metal silicide layer is located at the bottom part. Since the contact plug is formed on the manganese oxide layer, which can sufficiently exert an effect of suppressing copper atom diffusion even if it is thin. Therefore, it is possible to provide a contact plug made of copper (Cu) that does not adversely affect, for example, the source or drain characteristics of transistors. Moreover, even if the diffusion barrier layer of the double layer structure according to the conventional technology is not used, it is possible to provide a copper (Cu) contact plug with low contact resistance.

In accordance with a third aspect of the present invention, a method for forming a contact plug at a contact hole of an insulating layer in a semiconductor device includes the steps of:
forming a metal silicide layer on a bottom surface of the contact hole of the insulating layer;
forming a copper-manganese alloy layer on the metal silicide layer, wherein the copper-manganese alloy layer fills substantially the contact hole of the insulating layer; and
applying a heat treatment process so as to form a manganese oxide layer, wherein the heat treatment process comprises a step of diffusing manganese in the copper-manganese alloy layer toward an interface with the metal silicide layer and changing a part of the copper-manganese alloy layer to a copper layer.

According to the third aspect of the present invention, as described above, the heat treatment process is applied after the copper-manganese alloy layer has been deposited on the metal silicide layer. Therefore, it is possible to simultaneously form the manganese oxide layer at the area in the vicinity of an interface of the alloy layer and the metal silicide layer, and the copper (Cu) that constitutes the contact plug at the upper portion of the alloy layer.

In accordance with a fourth aspect of the present invention, a method for forming a contact plug at a contact hole of an insulating layer in a semiconductor device includes the steps of:

forming a metal silicide layer on a bottom surface of the contact hole of the insulating layer;

forming a copper-manganese alloy layer on the metal silicide layer;

forming a buried copper on the copper-manganese alloy layer; and applying a heat treatment process so as to form a manganese oxide layer, wherein the heat treatment process includes diffusing manganese in the copper-manganese alloy layer toward an interface with the metal silicide layer to change a part of the copper-manganese alloy layer into a copper layer which unifies with the buried copper.

According to the fourth aspect of the present invention, as described above, the heat treatment process is applied after the copper-manganese alloy layer has been deposited on the metal silicide layer. Therefore, it is possible to simultaneously form the manganese oxide layer at the area in the vicinity of an interface of the alloy layer and the metal silicide layer, and the copper (Cu) that constitutes the contact plug at the upper portion of the alloy layer. Further, the copper (Cu) can be unified with the buried copper.

In accordance with a fifth aspect of the present invention, a method for forming a contact plug at a contact hole of an insulating layer in a semiconductor device includes the steps of:

forming a metal silicide layer on a bottom surface of the contact hole of the insulating layer;

forming a copper-manganese alloy layer on the metal silicide layer; and conducting a heat treatment in an atmosphere including oxygen at a temperature of not less than 150° C. and not more than 550° C.

According to the fifth aspect of the present invention, as described above, by conducting the heat treatment under the condition mentioned above, manganese in the copper-manganese alloy layer will be diffused, which results in changing a part of the copper-manganese alloy layer to be formed only of copper, and which also results in forming a manganese oxide layer between the copper part and the metal silicide layer.

In accordance with a sixth aspect of the present invention, a method of forming a contact plug at a contact hole of an insulating layer in a semiconductor device includes the steps of:

forming a metal silicide layer on a bottom surface of the contact hole of the insulating layer;

forming a copper-manganese alloy layer on the metal silicide layer; and conducting a heat treatment in an atmosphere including oxygen at a temperature of not less than 450° C. and not more than 550° C.

According to the sixth aspect of the present invention, as described above, by conducting the heat treatment under the condition mentioned above, two kinds of manganese oxide layers will be formed, which are a first manganese oxide layer formed on the metal silicide layer and a second manganese oxide layer formed on the first manganese oxide layer. Specifically, the first manganese oxide layer is amorphous and includes silicon, and the second manganese oxide layer is a mixture of amorphous and microcrystals.

In accordance with a seventh aspect of the present invention, a contact plug structure formed on a contact hole of an insulating layer of a semiconductor device includes:

a metal silicide layer formed on a bottom part of the contact hole of the insulating layer;

a barrier layer formed on the metal silicide layer in the contact hole;

a manganese oxide layer formed on the barrier layer in the contact hole; and a buried copper formed on the manganese oxide layer, the buried copper substantially filling the contact hole of the insulating layer.

According to the seventh aspect of the present invention, as described above, because a barrier layer is provided between the metal silicide layer and the manganese oxide layer, diffusion of copper atoms can be further suppressed.

In accordance with an eighth aspect of the present invention, a method for forming a contact plug at a contact hole of an insulating layer in a semiconductor device includes the steps of:

forming a metal silicide layer on a bottom surface of the contact hole of the insulating layer;

forming a barrier layer on the metal silicide layer;

forming a manganese oxide layer on the barrier layer; and forming a buried copper on the manganese oxide layer.

According to the eighth aspect of the present invention, as described above, the contact plug which has the barrier layer between the metal silicide layer and the manganese oxide layer can be formed. This contact plug can further suppress diffusion of copper atoms.

BRIEF DESCRIPTION OF DRAWINGS

FIGS. 8(a)-8(c) show formation steps of: a contact plug of the example 2.

FIGS. 16(a)-16(c) are figures that explain the first half of the method to form the contact plug in the example 4.

DETAILED DESCRIPTION OF THE INVENTION

Figure 1:
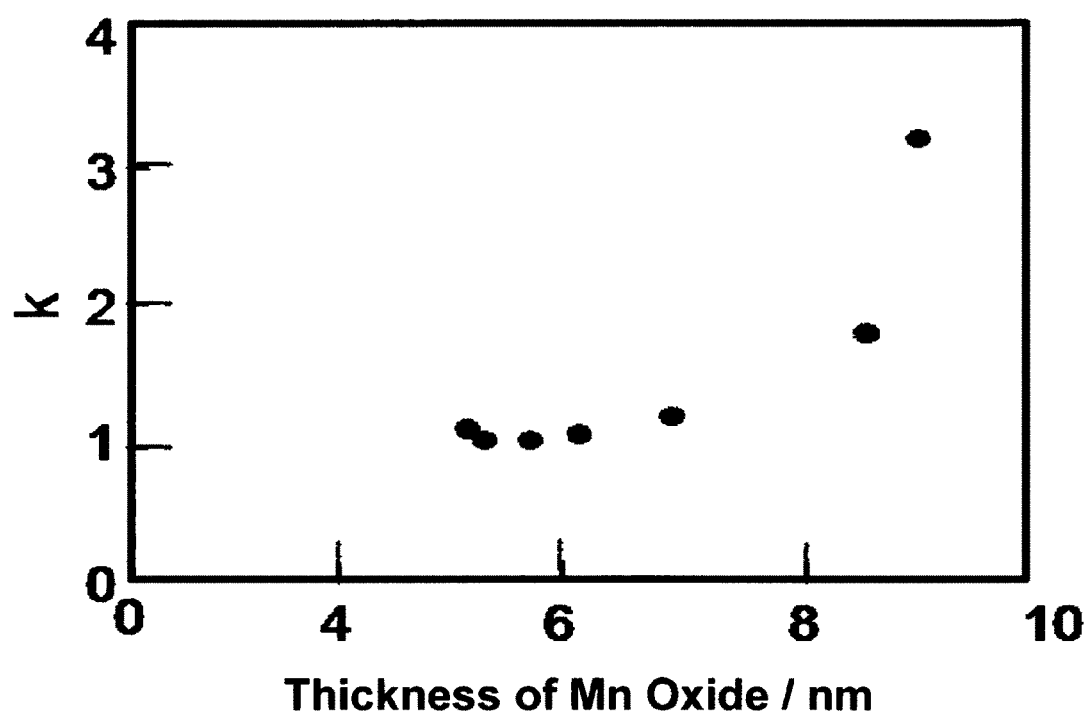
FIG. 1 shows a relationship between a layer thickness of the manganese oxide layer and an exponent (k) in current-voltage characteristics in the first embodiment.

Embodiments of the present invention will be described hereinafter with reference to the accompanying drawings, in which the preferred exemplary embodiments of the invention are shown. The ensuing description is not intended to limit the scope, applicability or configuration of the disclosure. Rather, the ensuing description of the preferred exemplary embodiments will provide those skilled in the art with an enabling description for implementing the preferred exemplary embodiments of the disclosure. It should be noted that this invention may be embodied in different forms without departing from the spirit and scope of the invention as set forth in the appended claims.

First Embodiment

A metal silicide layer for forming a manganese oxide layer of the first embodiment of the present invention is formed at an active region of a transistor element that exerts functions of a source, drain, and/or gate composed of semiconductor silicon that are formed at surface parts of a substrate composed of silicon, glass, etc. The metal silicide layer is formed as an electrode, etc., at the active region of the transistor element composed of semiconductor silicon. The metal silicide is a chemical compound of a metallic element and silicon (Si). Examples of the metallic element are; magnesium (element symbol: Mg), platinum, (element symbol: Pt), hafnium (element symbol: Hf), molybdenum (element symbol: Mo), tantalum (Ta), vanadium (element symbol: V), niobium (element symbol: Nb) and chrome (element symbol: Cr). From the viewpoint of electrical characteristics, a metal silicide that includes any of cobalt (Co), titanium (Ti), nickel (Ni) and tungsten (W) is especially used in this invention.

With regard to the metal silicide layer, first, any metal layer of cobalt (Co), titanium (Ti), nickel (Ni), and tungsten (W) is deposited on a surface of the silicon substrate where the active region of the transistor elements are formed. The deposition is performed by a metal deposition method such as a physical vapor deposition (PVD) where a target made from one of those metals is sputtered or a chemical vapor deposition (CVD) where alicyclic compounds, etc., such as a carbonyl compound or a cyclopenta compound which includes one of those metals are used as materials. Material that may be used in forming the cobalt (Co) layer using chemical vapor deposition is, for example, cyclopentadienyl cobalt dicarbonyl (rational formula: $C_5H_5Co(Co)_2$).

Next, the metal layer is heated along with the silicon substrate, which allows silicon to react with the metal that constitutes the metal layer, thereby forming the metal silicide layer. For example, in order to form a nickel (Ni) silicide layer after silicidation of nickel (Ni) layer, a heat treatment in a vacuum or inert gas atmosphere at a temperature of not less than 400° C. and not more than 800° C. is desirable. If the heat temperature is less than 400° C., the entire nickel (Ni) layer cannot be converted to nickel (Ni) silicide, thus unreacted nickel (Ni) remains at an upper part of the nickel (Ni) layer. On the other hand, if the temperature is more than 800° C., the entire nickel (Ni) layer can be converted to nickel (Ni) silicide, however, silicon (Si) diffuses to the surface of the nickel (Ni) silicide layer, therefore, this too is not desirable. This is because that the nickel (Ni) that remains on the surface because of the insufficient heat treatment or the silicon (Si) that rises to the surface because of heat treatment with high temperature causes problems of increase in contact resistance of contact plug and electrical resistance of copper interconnection due to penetration of the nickel or the silicon into the inside of the contact plug or the copper (Cu) electronically connected to the contact plug.

Moreover, the metal silicide layer may also be formed by the sputtering method where a target composed of the metal silicide is used. For example, it is possible to form the metal silicide layer by a high frequency sputtering method with a target composed of tungsten (W) silicide. Moreover, it is also possible to form the metal silicide layer by a physical or chemical vapor deposition method where silicon (Si) and any metal of cobalt (Co), titanium (Ti), nickel (Ni), or tungsten (W) are simultaneously supplied. Regardless of the method used, applying a heat treatment to the metal silicide layer can improve the adhesiveness to the silicon substrate.

The metal silicide layer limitedly remains in the specific area, for example, the active region of the transistor elements, which requires an electrode which is composed of the metal silicide layer. In order to form the metal silicide layer in the specific area on the silicon substrate, there is a means that the metal silicide layer is selectively deposited from the beginning by using a mask material in the specific area where the metal silicide layer is necessary. The mask material must contain an opening at the area where the metal silicide layer needs to be provided. If this mask material is composed of a silicon oxy-carbide (SiOC) layer that can be used as an interlayer insulating layer, there is a possibility to utilize the opening formed in the layer as a contact hole.

However, if this way is adopted, the metal silicide layer will also adhere to a sidewall of the opening corresponding to a sidewall of the contact hole. This leads to an inconvenience where a sufficient electrical insulation property between a contact plug and the sidewall of the opening (the sidewall of the contact hole) cannot be maintained. It might be possible to remove the metal silicide layer adhered to the sidewall of the opening by etching, using a chemical means such as a wet etching method or a physical means such as a plasma etching method. However, because it is difficult to remove only the metal silicide layer adhered to the sidewall of the opening, the metal silicide layer deposited on the bottom part of the opening is also removed. This is also inconvenient.

Another means where the metal silicide layer limitedly remains in the specific area such as an active region of transistor elements is forming the metal silicide layer on an entire surface of the silicon substrate once by using the chemical or physical vapor deposition method, after that, removing an unnecessary metal silicide layer by using a patterning technology according to a well-known photo lithography technology and a selective etching method associated to the patterning technology, thereby the metal silicide layer remains only in the specific area. For example, when an electron beam patterning method or a double exposure technology that uses short wave ultra violet waves as a light source, it is beneficial because the metal silicide layer of 32 nanometers (unit: nm) or 21 nm width can also be securely formed industrially.

Even in the means where the metal silicide layer is uniformly formed on the entire surface of the silicon substrate once, the heat treatment to increase the adhesiveness with the silicon substrate is performed after the metal silicide layer remains only in the specified area by etching. Moreover, the heat treatment process implemented for silicidation of the metal layer is also performed after the metal layer that constitutes the silicide layer remains only in the specified area. If done otherwise, the metal silicide layer is formed due to reaction of the metal and silicon even in a region where the metal silicide layer is unnecessary, for example, a region other than the active region of a transistor element. As a result, there will be an unexpected electric leak of supplied current from the contact plug made of copper (Cu), which causes a problem in obtaining transistor elements with low power consumption and also integrated circuits that include those transistor elements.

The contact hole (connection hole) is formed on the metal silicide layer formed on the specific areas such as the active region of transistor elements. The contact plug is for forming the contact plug composed of copper that is electrically connected to the metal silicide layer. The contact hole is formed in an electrically insulating layer, for example, an insulating layer on the silicon substrate or an interlayer insulating layer to constitute a damascene type multi layer interconnection structure. The insulating layer is formed of inorganic or organic compounds with low dielectric constant that include silicon (Si) such as silicon oxide (composition formula $SiO_x$; mostly X is 2), silicon nitride ($Si_YN_Z$; mostly Y=3, Z=4), silicon nitride oxide (SiNO), silicon fluoride oxide (SiFO). The insulating layer may also be formed of so-called porous silicon (Si) compounds such as silsesquioxane hydride (HSQ) or methyl silsesquioxane (MSQ), which has small voids inside.

The manganese oxide layer that acts as a diffusion barrier layer against diffusion of copper (Cu) atoms is formed on the metal silicide layer exposed at the bottom part of the contact hole that is a through hole. The manganese oxide layer referred to in this invention is a collective term for a layer that is composed of manganese oxide such as manganese mono-oxide (composition formula: MnO), manganese dioxide (composition formula: $MnO_2$), manganese trioxide (composition formula: $Mn_2O_3$) and tri-manganese tetroxide (composition formula: $Mn_3O_4$), and also for a manganese oxide that is composed of an mixture of these. The composition of manganese compounds can be investigated by analyzing a binding energy of manganese (Mn) and oxygen (O) using an X-ray photoelectron spectroscopy (XPS) method.

It is possible to form the manganese oxide layer on the metal silicide layer using several technical methods. One of them is forming the manganese (Mn) layer on the metal silicide layer and then forming the manganese oxide layer by reacting the manganese (Mn) layer with oxygen (O). For example, it is the method for forming manganese oxide layer by oxidizing the manganese (Mn) layer formed by chemical vapor deposition where bisethyl cyclopentadienyl manganese (rational formula: $(C_2H_5C_5H_5)_2Mn$) is taken as a source material of the manganese (Mn) and hydrogen gas (molecular formula: $H_2$) is taken as a carriage gas. The benefit of this formation method is that the manganese oxide layer can be formed easily even if the width of the contact hole is narrow.

The temperature when forming the manganese oxide layer on the nickel (Ni) silicide layer with a composition of, for example, $Ni_2Si$, NiSi, $NiSi_2$, and $Ni_3Si_2$ by using chemical vapor deposition is preferable at not less than 100° C. and not more than 400° C. If the temperature is low, which is less than 100° C., the manganese oxide layer will not be formed uniformly on the metal silicide layer. On the other hand, if the temperature is high, which is more than 400° C., there will be a high amount of carbon (element symbol: C) in the manganese oxide layer mainly due to thermal decomposition of hydrocarbon group that is added to the material compound. Therefore, this results in a manganese oxide layer that is inferior in adhesiveness with the metal silicide layer. This is also inconvenient.

One more method is the method using physical vapor deposition. For example, it is the method for forming a manganese (Mn) layer by a high-frequency sputtering method, after that, forming the manganese oxide layer by oxidizing the manganese layer. High purity manganese (Mn) is desirable as the target when sputtering manganese (Mn). It is especially desirable that the target is composed of high purity manganese (Mn) of 99.999% (=5N) or higher, which does not contain elements of which the oxide formation enthalpy is higher than the MnO formation enthalpy or contains small amount of such elements. By using such high purity manganese (Mn) target, it is possible to get a manganese oxide layer containing small amount of metal impurities that cause current leakage during transistor element operation.

Moreover, one more other method, for example, is the method of forming the manganese oxide layer on the metal silicide layer by sputtering method using manganese oxide as a sputter target. According to this method, the benefit that has been seen is that the operation of oxidization of a manganese (Mn) layer is not necessary for forming the manganese oxide layer. Moreover, if a target with a different composition of a manganese oxide is used, it is also convenient in forming the manganese oxide layer of the different composition according to the difference of the manganese oxide that constitutes the target. For example, by using the individual target made of manganese monoxide (MnO) or manganese dioxide ($MnO_2$) respectively, it is possible to conveniently form a manganese oxide layer having a double layer structure. In the double layer structure, an area on the surface of the metal silicide layer is composed of a manganese mono-oxide layer, and a side of the manganese silicide layer where the contact plug made of copper is formed is composed of manganese dioxide.

In this invention, the manganese oxide layer on the metal silicide layer is composed of the layer especially from amorphous material without crystal grain boundary. This is because unexpected leakage of transistor operation current like a short circuit into the active region of the transistors such as the gate area through the crystal grain boundary can be avoided. Therefore, it is possible to stably provide transistor elements for constituting integrated circuits, etc., with a normal gate action with excellent pinch off characteristics. In order to obtain the manganese oxide layer of amorphous material without depending on the method of formation of the manganese oxide layer such as the chemical vapor deposition method or the physical vapor deposition method, it is preferable to form the manganese (Mn) layer or the manganese oxide layer at low temperature.

Moreover, in this invention, the manganese oxide layer formed on the metal silicide layer is especially composed of the manganese oxide that contains silicon (Si). Therefore, it is possible to obtain a manganese oxide layer with superior adhesiveness with the metal silicide layer due to an effect of silicon contained in the manganese oxide layer. It is necessary to form the manganese oxide layer so that silicon (Si) which constitutes the metal silicide layer can penetrate into the inside of the manganese oxide layer. It is necessary to form the manganese oxide layer under a condition which is appropriate to obtain the manganese oxide layer which is amorphous and includes silicon (Si), especially in the appropriate temperature range. For example, the preferable temperature range for forming the manganese oxide which is amorphous and includes silicon (Si) on a titanium (Ti) silicide layer, is approximately from 100° C. to equal to or less than 400° C. Incidentally, when the manganese oxide layer is formed by CVD, this temperature range is for forming the manganese oxide layer. On the other hand, when the manganese oxide layer is formed by PVD, this temperature range is for oxidation of the manganese layer or forming the manganese oxide layer. This makes it possible to form the manganese oxide layer planarly adhered to the entire surface of the metal silicide layer, thus, it is possible to expand the range of a flowing path of transistor element operating current to the metal silicide layer through the contact plug on the manganese oxide layer. As a result, it is possible to eventually contribute to providing a contact plug of low contact resistance.

One expedient method to obtain the manganese oxide layer including silicon (Si) is to form the manganese oxide layer after oxidizing the surface of the metal silicide layer. It is the method of forming the manganese oxide layer after oxidizing the metal silicide layer using, for example, oxygen plasma. If the metal silicide layer is a nickel (Ni) silicide layer, an example of the condition for oxidizing the surface is exposing the surface to the oxygen plasma that is generated by applying high-frequency power of 50 watts (unit: W) in a reduced pressure environment where the pressure is 50 pascal (Unit: Pa) for 30 minutes. Under the condition shown by this example, an amorphous oxide layer of approximately 1 nm is formed on the surface of the nickel (Ni) silicide layer.

The thickness of the oxide layer formed at the metal silicide layer increases in proportion to the square root value of the oxidation time. The oxide formed on the surface portion of the metal silicide layer by oxidizing the surface of the metal silicide layer is mainly the oxide of the element that constitutes the metal silicide layer and has lower enthalpy of oxide formation. For example, an electrical resistivity of titanium oxide (TiO) of sodium chloride (NaCl) crystal type at a temperature of 300 kelvin (Unit: K) is $3 \times 10^{-6}$ Ohm Meter (Unit: $\Omega \cdot m$) (Co-authored by Tsuda, Nasu, Fujimori, and Shiratori, "Electroconductive oxide (Revised edition)" (Feb. 10, 1999, issued by Shokabo Co., 7th revised version, page 26). Moreover, for example, an insulation resistivity of tungsten oxide (composition formula $WO_2$) of rutile crystal type at 300 K is $3 \times 10^{-5} \Omega \cdot m$ ("Electroconductive oxide (Revised edition)" mentioned above, page 30). The insulation resistivity of the oxide of amorphous material used in this invention is generally higher than the oxide of crystal form. Therefore, in order to obtain a contact plug formed of copper (Cu), which has low contact resistance, it is preferable to set the layer thickness of the oxide layer formed on the surface of the metal silicide layer to be not more than 1.5 nm. Moreover, it is preferable to set the layer thickness to be not more than 1 nm. On the other hand, in order to form a manganese oxide layer that includes silicon (Si), an oxide layer that has thickness of not less than 0.5 nm is necessary. The thickness of the oxide layer can be measured using, for example, the transmission electron microscope (TEM), etc.

It is preferable that the oxide layer formed by oxidization of the metal silicide layer is composed of amorphous material rather than a single crystal or a polycrystal. It is possible to form the metal silicide layer of amorphous material by appropriately adjusting the layer forming conditions. For example, it is possible to advantageously form it by setting the processing temperature to be a low temperature which is roughly from an ambient temperature to less than 100° C. Because the amorphous material without crystal grain boundary is used, the magnitude of transistor operation current leaked through the crystal grain boundary can be reduced. In other words, it is possible to form a contact plug using copper that shows less leakage of transistor operation current. As a result, it is possible to eventually contribute to providing transistor elements with low power consumption and integrated circuits that include those transistor elements as structural elements.

The thickness of manganese oxide layer formed on the metal silicide layer is the thickness that can generate Ohmic contact between the copper of the contact plug and the metal silicide layer. The relationship between a current and a voltage between the contact plug and the metal silicide layer is shown in the relational expression (1) below.

$$I = A \times V^k \qquad \text{(Relational expression 1)}$$

In the relational expression 1 shown above, I shows a current, V shows a voltage, A shows a constant of proportion and k shows an exponential power constant. In the relational expression 1, k is 1 in a case where the contact plug is in Ohmic contact with the metal silicide layer. If k is more than 1 (k>1), it means that the contact plug and the metal silicide layer have not achieved Ohmic contact. In other words, the thickness of the manganese oxide layer in this invention should be not more than a thickness that leads to a current-voltage characteristic of k=1 in the relational expression 1.

An exponential power (=k) value is exemplified in FIG. 1. The exponential power value is calculated by a current-voltage characteristic between copper constituting the contact plug and a nickel (Ni) silicide layer when manganese oxide layers of different thicknesses are inserted as a diffusion barrier layer. The horizontal axis shows the thickness of the manganese oxide layer and the vertical axis shows the exponential power k.

The nickel (Ni) silicide layer is formed using a physical vapor deposition method at 400° C. on the silicon substrate. Further, the oxygen plasma treatment is applied to the surface of the nickel (Ni) silicide layer. The manganese oxide layer that has a layer thickness of 5 nm-9 nm is formed by using a chemical vapor deposition method, changing the layer formation temperature and time. Copper is deposited on the manganese oxide layer using the sputtering method, which leads to the contact plug. As exemplified in FIG. 1, if the thickness of the manganese oxide layer is not more than 7 nm, the value of k becomes 1 within the range of experimental error, in other words, the Ohmic contact between the copper that constitutes the contact plug and the nickel (Ni) silicide layer is achieved. On the other hand, if the manganese oxide layer with thickness of more than 7 nm is used, the k value becomes high, which is more than 1. If the manganese oxide layer with thickness of 9 nm is used, the k value becomes 3.

Therefore, it is necessary that the thickness of the manganese oxide layer is not more than 7 nm when forming the contact plug composed of copper that constitutes the contact plug having Ohmic contact with the nickel (Ni) silicide layer. On the other hand, it is necessary that the thickness of the manganese oxide layer is not less than 0.5 nm in order to be able to uniformly deposit the surface of the metal silicide layer. Moreover, in a case of using a silicide layer of cobalt (Co), the same dependency of the k value on the manganese oxide layer thickness as the nickel (Ni) silicide layer can be obtained (Refer to FIG. 1). The layer thickness of the manganese oxide layer that is appropriate for being formed on the cobalt silicide layer is not less than 0.5 nm and not more than 7 nm, which is the same as the nickel (Ni) silicide layer. This most appropriate thickness range of the manganese oxide layer is valid regardless of the differences in composition of the silicide layer composed of cobalt such as $CO_2Si$, $COSi$, $COSi_2$, etc. Furthermore, it is more preferable that the layer thickness of the manganese oxide layer is not less than 1.5 nm and not more than 5 nm.

A diffusion barrier layer can be formed that securely exhibits the diffusion barrier for the copper (Cu) atom if the manganese oxide layer on metal silicide is formed by changing the binding energy of manganese (Mn) and oxygen (O) in the direction of the depth of that layer thickness. Especially, it is possible to favorably form the diffusion barrier layer from the manganese oxide layer where the energy of, for example, 2 p orbit of a manganese (Mn) atom increases from the surface towards the deep portion in the direction of the layer thickness, in other words, the binding energy of manganese (Mn) atom and oxygen (O) increases from the surface towards the deep portion of the metal silicide layer. The binding energy of manganese (Mn) and oxygen in the depth direction in the manganese oxide layer can be analyzed using, for example, the X-ray photoemission spectroscopy method (XPS), etc.

The manganese oxide layer where manganese (Mn) that is bound with the oxygen (O) atom strongly and closely in the deep portion of the layer compared to the surface that touches the contact plug made of copper can be a diffusion barrier layer that securely prevents diffusion from the metal silicide layer into the manganese oxide layer and copper (Cu) that constitutes the contact plug. Therefore, it is possible to achieve a contact plug made of copper (Cu) with low resistance and it is eventually possible to provide transistor elements that constitute the integrated circuits with low power consumption. The manganese oxide layer mentioned above that includes manganese (Mn) that increases the binding energy with oxygen (O) in the direction of the deep portion of the layer can be securely formed by placing as an underlying layer the metal silicide layer where the oxidization process mentioned above was implemented. There is quantitative difference in oxygen (O) that is dispersed into the manganese oxide layer depending on the difference in distance from the oxide layer on the metal silicide layer. This contributes to forming the manganese oxide layer that includes manganese (Mn) that has different binding energy.

A copper (Cu) layer constituting the contact plug is formed on the manganese oxide layer. The copper (Cu) layer can be formed using a means such as a physical vapor deposition method, a chemical vapor deposition method, and an electroplating method (EP). Regardless of the means, it is desirable that material such as high-purity copper (Cu) or copper (Cu) containing compounds is used in forming the copper (Cu) layer. Moreover, an alloy layer of copper (Cu) and metal where the diffusion constant is greater than copper (Cu), such as magnesium (element symbol (Mg)), can also be used.

Especially, as a means to form a contact plug made of copper (Cu) on a metal silicide layer, there is a method to utilize an alloy layer of copper (Cu) and manganese (Mn) (refer to unexamined patent publication JP2008-300567). In this method, first, a copper (Cu)-manganese (Mn) alloy layer is deposited on the metal silicide layer or the oxide layer formed on the metal silicide layer. It is desirable that the layer to be deposited is a copper (Cu)-manganese (Mn) alloy layer where atomic concentration of manganese (Mn) is within a range of 0.5% to 20%. Especially, it is preferable that atomic concentration of manganese (Mn) of a copper (Cu)-manganese (Mn) alloy layer is within a range of 2% to 10%.

The copper (Cu)-manganese (Mn) alloy layer can be formed by a chemical vapor deposition method where cyclopentadienly (triethylphosphine) copper (I) or bis(ethylcyclopentadienyl)manganese are used as materials. Moreover, it can be formed by a physical vapor deposition method such as a high frequency sputtering method or a laser ablation method where a target composed of a copper (Cu)-manganese (Mn) alloy is used. The copper (Cu)-manganese (Mn) alloy layer is formed at a temperature at which a smooth copper (Cu)-manganese (Mn) alloy layer can stably be obtained so that the copper (Cu)-manganese (Mn) alloy does not become an aggregated deposited matter. For example, if the high frequency sputtering method is used, the appropriate temperature for forming a smooth copper (Cu)-manganese (Mn) alloy layer is less than 80° C. The copper (Cu)-manganese (Mn) alloy layer can also be formed by a plating method.

Heat treatment is applied to the deposited copper (Cu)-manganese (Mn) alloy layer. The heat treatment is performed in inert gas atmosphere that includes oxygen (O). For example, the heat treatment is applied in vacuum atmosphere that includes oxygen gas (molecular formula: $O_2$) at partial pressure within the range of $10^{-4}$ Pa to $10^{-1}$ Pa or in atmosphere composed of inert gas such as argon (element symbol: Ar), helium (element symbol: He) or neon (element symbol: Ne) that has oxygen with the same partial pressure. It does not matter if the inert gas that constitutes the heat treatment atmosphere is of one or the mixture of two types or even more. For example, only argon (Ar) atmosphere is acceptable, however, for example mixed gas of argon (Ar) and helium (He) is also acceptable. The heat treatment is appropriate at the temperature of not less than 150° C. and not more than 550° C. If density of oxygen in the atmosphere is low, it is possible to effectively oxidize the copper (Cu)-manganese (Mn) alloy layer by setting the temperature of the heat treatment to be high.

By heating the copper (Cu)-manganese (Mn) alloy layer in an atmosphere that includes oxygen (O), the manganese (Mn) atoms in the alloy layer diffuse towards the metal silicide layer side, and thus a manganese oxide layer is formed at an interface between the metal silicide layer and the alloy layer. In addition, at the same time, an upper portion of the alloy layer is formed of pure copper because manganese (Mn) diffuses and escapes from the alloy layer. This pure copper (Cu) can be used as the contact plug formed of copper (Cu) constituting the contact plug. In other words, the method to use copper (Cu)-manganese (Mn) alloy layer is the means to form the manganese oxide layer in an area around the interface with the metal silicide layer and simultaneously form the contact plug formed of copper (Cu).

If an interconnection provided on an insulating layer such as an interlayer insulating layer is electrically connected to the contact plug formed of copper, it is possible to form an interconnection having the contact plug formed of copper (Cu) of the present invention. For example, if aluminum (Al) that constitutes a circuit interconnection is electrically connected to the contact plug formed of copper (Cu), it is possible to form the interconnection of the present invention. Because the contact plug formed of copper (Cu) of the present invention has low contact resistance, it can contribute to configuring an interconnection with low resistance.

It is possible to form an interconnection with strong adhesion mutually if a material that constitutes the contact plug and a material that constitutes the interconnection are the same instead of using different materials for the contact plug and the interconnection. therefore, in order to obtain an interconnection which has superior adhesiveness with the contact plug formed of copper (Cu) and also has low electrical resistance, the best practice is to connect the contact plug formed of copper (Cu) to the interconnection formed of copper (Cu). If an interconnection is completely formed of copper (Cu) by electrically and mechanically connecting a damascene structure type circuit interconnection formed of copper (Cu) to the contact plug formed of copper, then it is also possible to form an interconnection superior in electro-migration resistance.

If the contact plug formed of copper (Cu) existing in the deep portion of the contact hole formed in the insulating layer such as an interlayer insulating layer cannot be connected to the copper (Cu) interconnection on the insulating layer directly, both the contact plug and the copper (Cu) interconnection are connected utilizing copper (Cu) buried on the contact plug inside the contact hole. It is possible to bury copper (Cu) at the upper portion of the contact plug inside the contact hole by using chemical or physical methods such as a non-electrolyte or electrolytic plating method or an ion plating method.

EXAMPLES

Example 1

The contents of this invention will be explained by detailing an example where a contact plug which is made of copper (Cu) and has a nickel (Ni) silicide layer as the metal silicide layer is formed.

Figure 2:
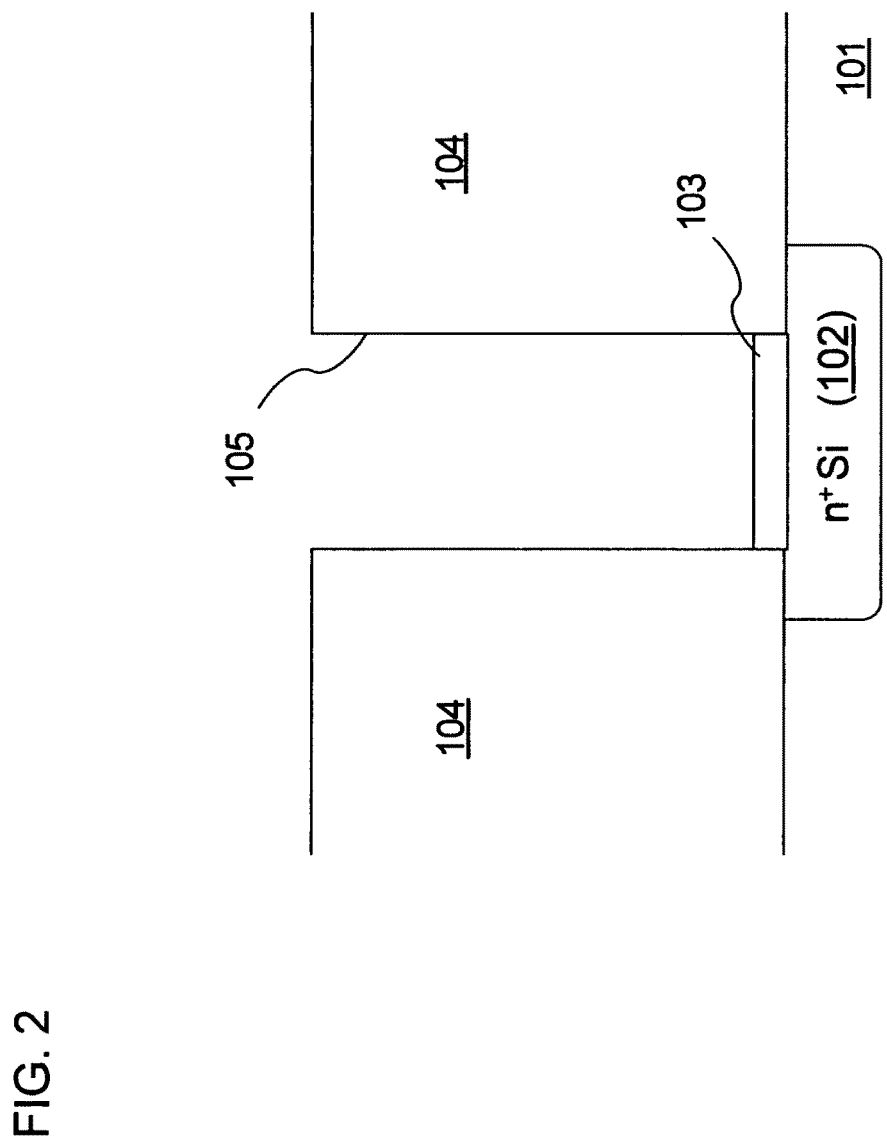
FIG. 2 shows formation steps of: a contact plug made of copper (Cu) in the example 1.
Figure 3:
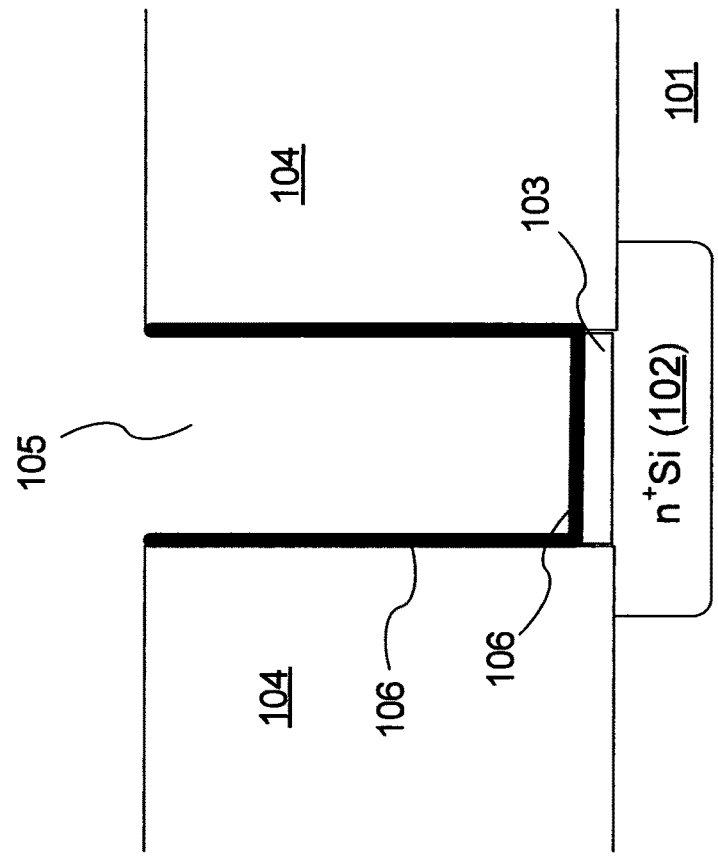
FIG. 3 shows formation steps of: a contact plug made of copper (Cu) in the example 1.
Figure 4:
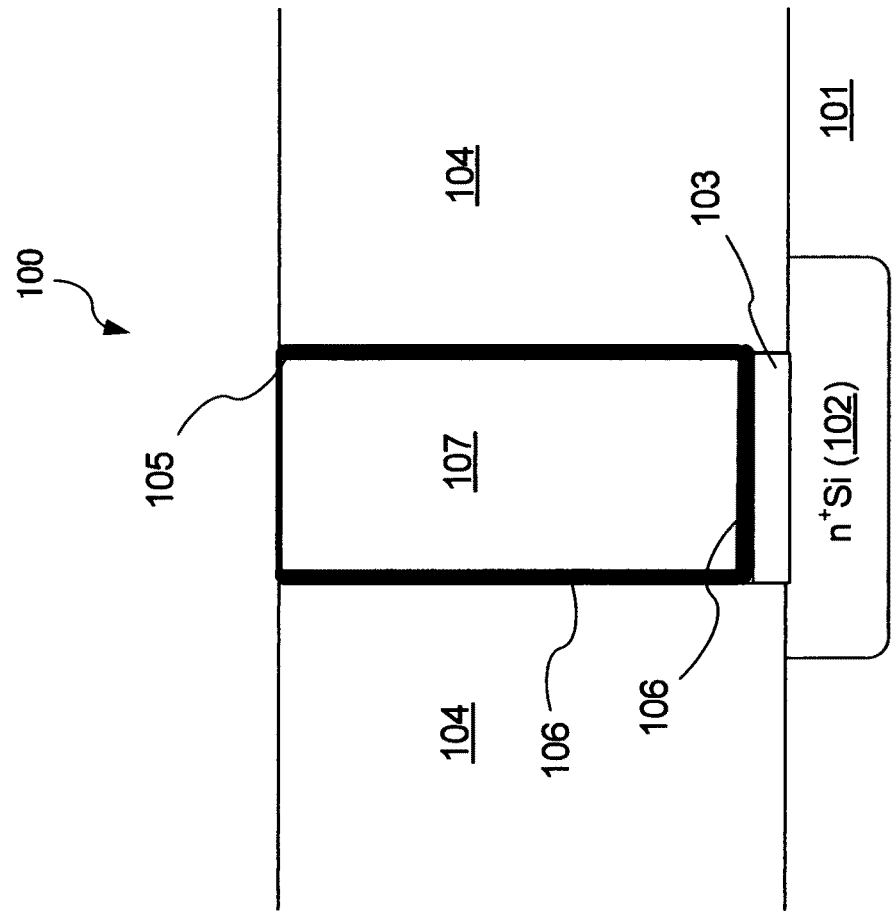
FIG. 4 shows formation steps of: a contact plug made of copper (Cu) in the example 1.
Figure 5:
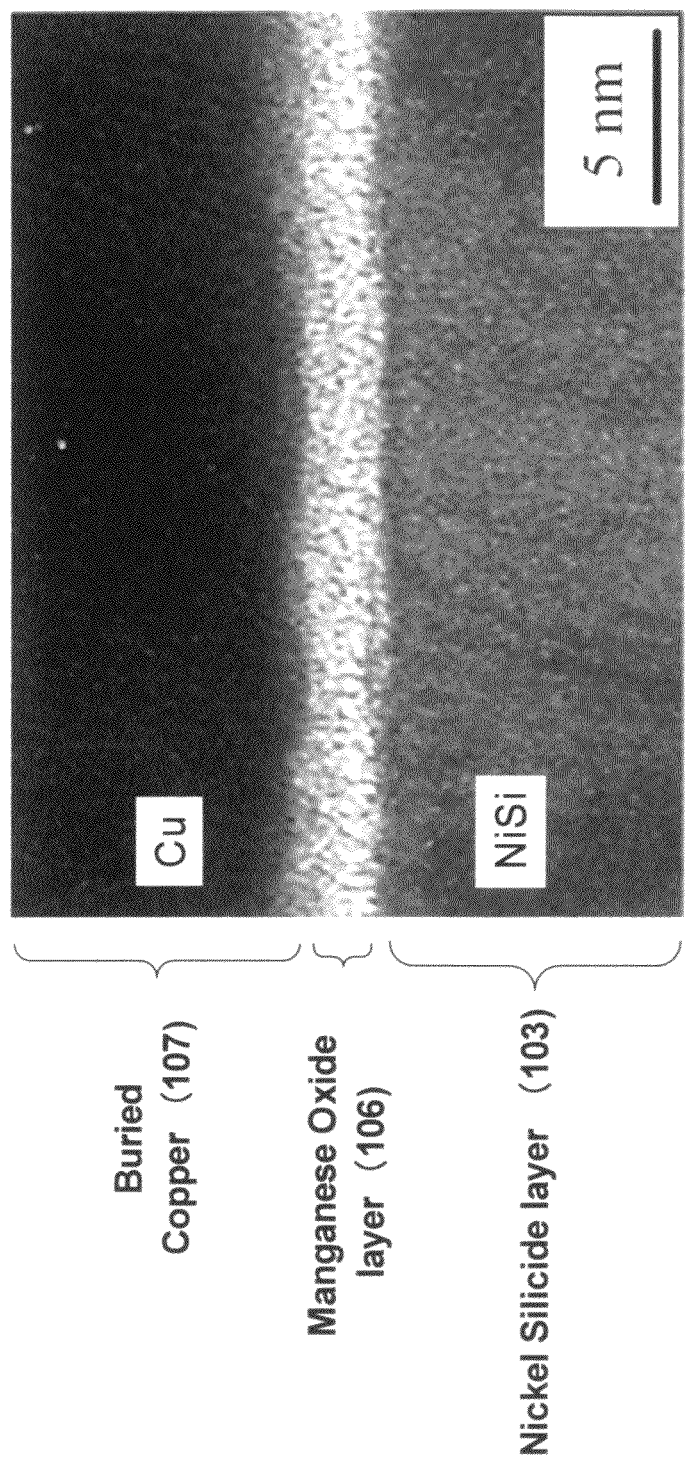
FIG. 5 shows a cross-sectional transmission electron microscope (TEM) image of a contact plug of the example 1.
Figure 6:
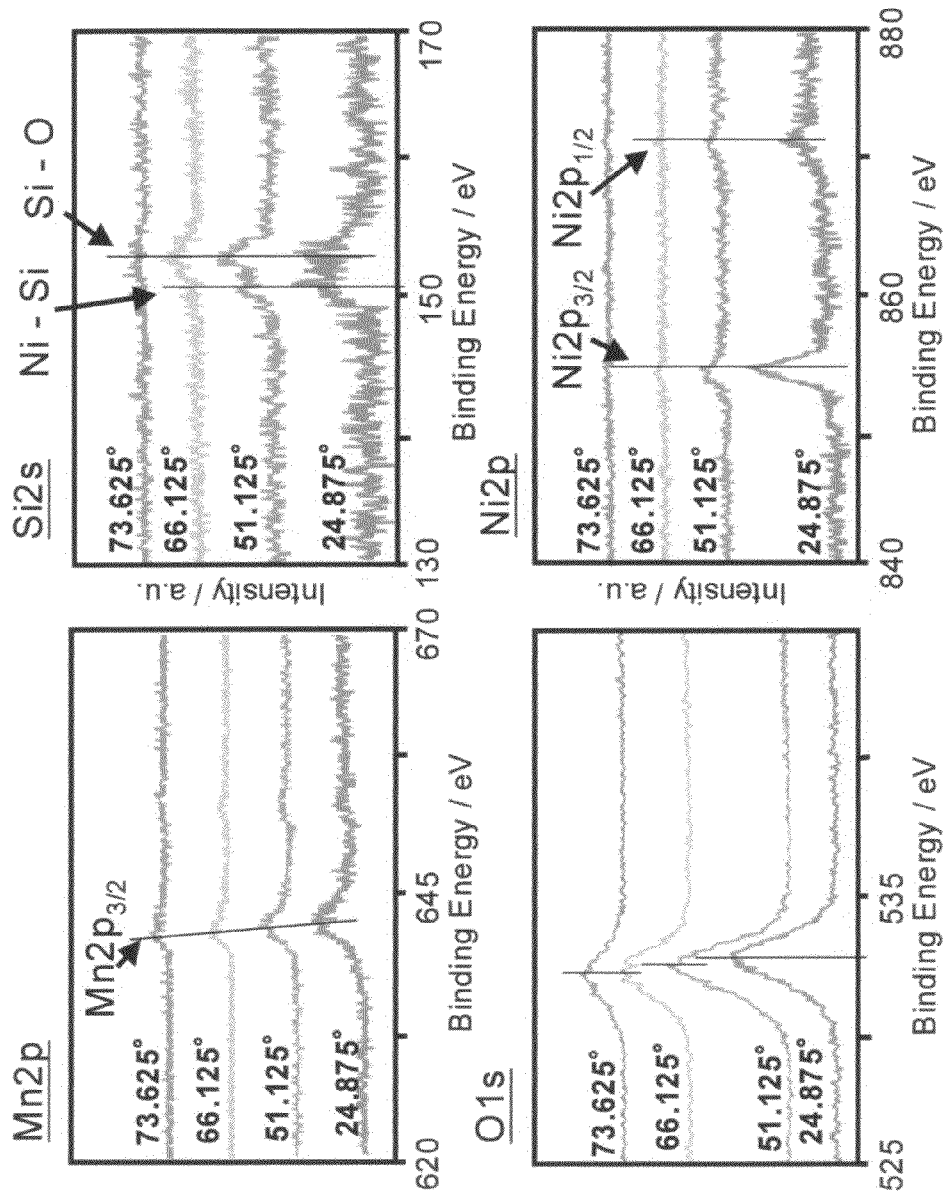
FIG. 6 shows an XPS analysis drawing of a manganese oxide layer of the example 1.

FIG. 2, FIG. 3, and FIG. 4 are figures that show the steps for forming the contact plug formed of copper (Cu) of this example. FIG. 5 is a cross-sectional transmission electron microscope (TEM) image of a laminated structure formed of a metal silicide (nickel (Ni) silicide) layer/a manganese oxide layer/copper (Cu). Moreover, FIG. 6 is an analysis figure that shows the binding state of manganese (Mn) that constitutes the manganese oxide layer.

The steps for forming the contact plug formed of copper (Cu) will be explained using FIG. 2-FIG. 4. First, a nickel (Ni) layer is formed using a physical vapor deposition method in order to form a metal silicide layer 103 on the complete surface of a silicon substrate 101 (refer to FIG. 2) having an active region 102 of an n type conductive element with high carrier concentration. The thickness of the nickel (Ni) layer is set to 3 nm. Next, the commonly known photo lithography technology and etching technology was used such that the nickel (Ni) layer remains only on the active region 102 of the element.

Next, heat treatment is applied to the remaining nickel (Ni) layer in an atmosphere of argon (Ar) for 1 hour at 400° C. to form the silicide layer. The nickel (Ni) silicide layer 103 is formed on the active region 102 of the element (refer to FIG. 2).

Next, an $SiO_2$ insulating layer 104 is formed so as to cover the active region 102 of the element or the metal silicide layer 103 once. After that, the insulating layer 104 over the metal silicide layer is removed. This way, as shown in FIG. 2, a contact hole 105 that exposes the metal silicide layer 103 at the bottom surface is formed. The width of the opening of the contact hole 105 is set to 45 nm.

Next, the oxidization process is implemented on the surface of the nickel (Ni) silicide layer 103 using oxygen plasma. By this oxidization process, an area of approximately 1 nm from the surface of the nickel (Ni) silicide layer 103 towards the inside is oxidized. It is assumed that silicon (Si) oxides of different compositions exist in the oxidized area. However, because the oxide layer is a thin layer as the thickness of the oxide layer was 1 nm, the composition could not be confirmed.

An amorphous manganese oxide layer 106 is formed on the surface of this nickel (Ni) silicide layer 103 where the oxide layer is formed at the surface layer part. The manganese oxide layer 106 is formed at 200° C. by the chemical vapor deposition (CVD) method where bis(ethylcyclopentadienyl)manganese (($C_2H_5C_5H_5)_2Mn$) is used as a material (refer to FIG. 3). The thickness of the manganese oxide layer 106 is set to 3.4 nm. Moreover, this manganese oxide layer 106 is also deposited on the sidewall of the contact hole 105 (refer to FIG. 3).

Changes of binding energy of manganese (Mn) that constitutes the manganese oxide layer 106 in a thickness direction are investigated by an X-ray photoelectron spectroscopy (XPS) method. FIG. 6 shows the results of the XPS analysis. An angle described in this figure is an angle formed by a normal direction of the surface of the manganese oxide layer 106 and the incident direction of the X-ray beam. The bigger this angle is, the more it gives the analysis information related to the binding energy of manganese (Mn) which is close to the surface of the manganese oxide layer 106. The bigger the angle is, as the energy of 2 p hybridized orbit of manganese (Mn) reduces, it is understood that the manganese oxide layer 106 described in this working example has a greater binding energy of manganese (Mn) in the direction of the deeper portion from the surface.

Next, copper is deposited on the manganese oxide layer 106 by the physical vapor deposition method to fill the contact hole 105, thereby forming a buried copper 107 with the layer thickness of 100 nm, which leads to a contact plug body 107 formed of copper (Cu) (refer to FIG. 4). In this way, a contact plug 100 composed of the metal silicide layer (nickel silicide layer) 103, the manganese oxide layer 106 and the buried copper (contact plug body) 107 is formed (refer to FIG. 4 and FIG. 5).

Separately, a contact resistance between the copper (Cu) and the metal silicide layer can be measured by a TLM (transmission line method) method. In this measurement, a sample where a manganese oxide layer was used as a barrier layer was manufactured and inserted. A contact resistance between the copper (Cu), the manganese oxide layer and the nickel (Ni) silicide layer in this example was $1.93 \times 10^{-6}$ $\Omega \cdot cm^2$, where a contact plug with a low contact resistance was realized. On the other hand, a contact resistance of tungsten (W) in a tungsten (W)-nickel (Ni) silicide layer structure measured in the same way was $2.06 \times 10^{-6}$ $\Omega \cdot cm^2$. Moreover, a contact resistance of copper (Cu) in a copper (Cu)-tantalum (Ta) layer-nickel (Ni) silicide layer structure was $1.57 \times 10^{-5}$ $\Omega \cdot cm^2$.

Copper (Cu) is buried on the contact plug 107 formed of copper (Cu) with low contact resistance. The copper is buried by a conventional plating method, being electrically and mechanically connected to the contact plug. The copper (Cu) is formed in order to be electrically connected to the interconnection located on insulating layer 104. The copper (Cu) is formed as if the copper (Cu) buried the inside of the contact hole 105.

Example 2

Next, FIG. 7 and FIG. 8 will be used to explain a case where a contact plug is manufactured after forming a manganese oxide layer and a buried copper by heating a copper-manganese alloy layer.

FIG. 7 is a pattern diagram that schematically shows steps for forming a manganese oxide layer and a buried copper by heating a copper-manganese alloy layer.

Figure 7B:
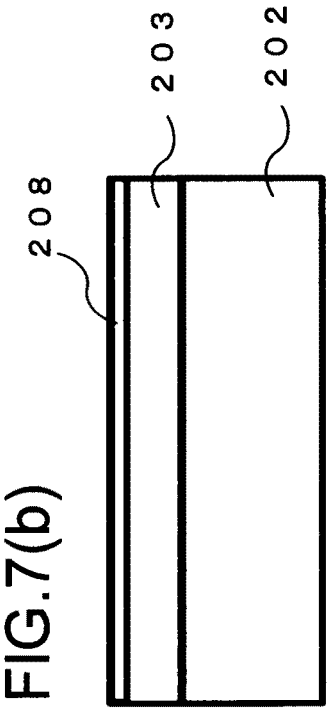
FIG. 7 shows a pattern diagram that shows steps for forming a manganese oxide layer and a buried copper schematically after heat treatment of copper-manganese alloy layer.
Figure 7D:
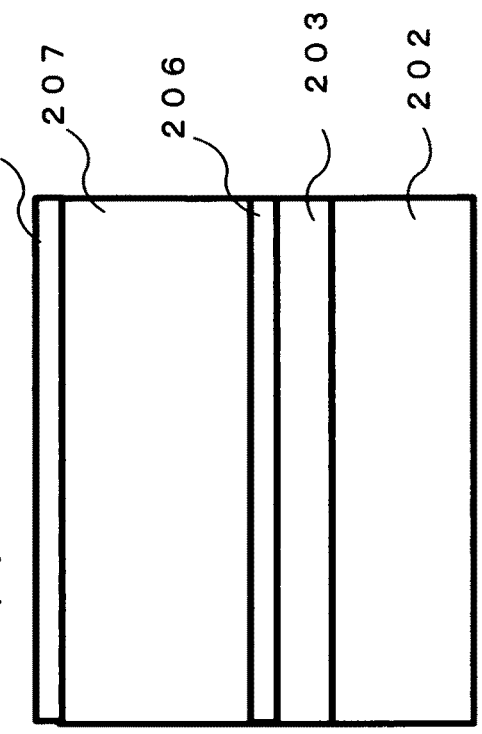
Figure 7A:
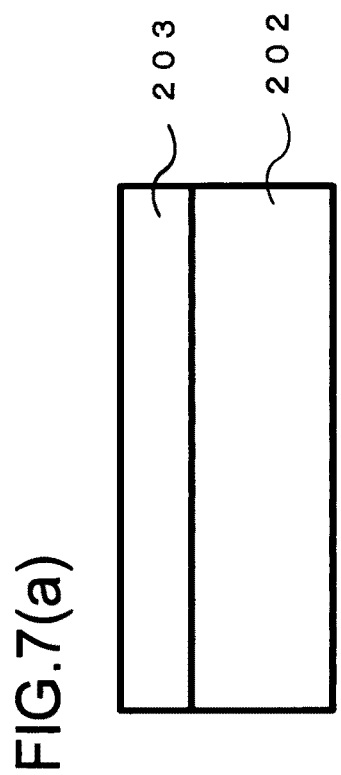
Figure 7C:
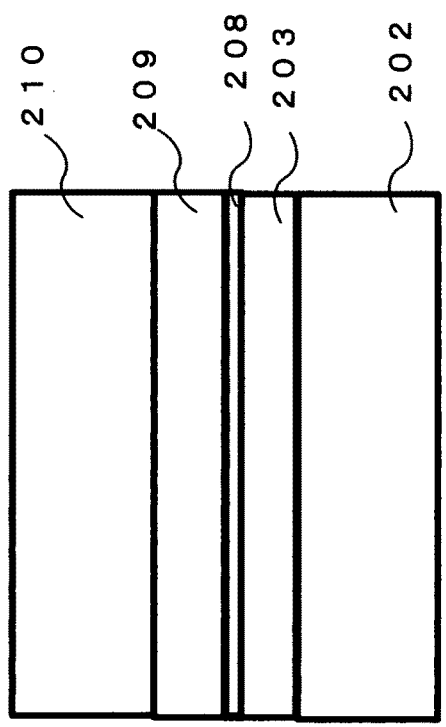

In FIG. 7(a), a silicon layer 202 is a substrate for forming a copper-manganese alloy. A thin cobalt layer is formed on the silicon layer 202 with thickness of 10 nm by a high frequency sputtering method. Then, heat treatment process is performed for one hour at 400° C. in vacuum, thereby changing the thin cobalt layer into the metal silicide layer 203 formed of cobalt. A plasma oxidation process is applied to this sample. The conditions for the plasma oxidization are; high-frequency output 100 W, oxygen pressure 40 Pa, at room temperature, and for 10 minutes. Using this process, the surface of the metal silicide layer 203 formed of cobalt is oxidized, thereby forming an oxide layer 208 on the surface. The oxide layer mainly includes an Si oxide (FIG. 7(b)).

A copper-manganese alloy layer 209 is formed on this surface of the substrate with thickness of 30 nm by a high frequency sputtering method. After that, a buried copper 210 of 100 nm thickness is formed by high-frequency-sputtering of a pure copper target (FIG. 7(c)). The acquired sample is heated for 30 minutes at 350° C. in an atmosphere having oxygen with an oxygen partial pressure of $10^{-2}$ Pa (heat treatment). By this heat treatment, manganese in the copper-manganese alloy layer 209 diffuses into an interface with the oxide layer 208, thereby forming an oxide layer (manganese oxide layer) 206 that includes manganese. Moreover, the manganese in the copper-manganese alloy layer 209 also diffuses into the surface of the buried copper 210, thereby forming an oxide layer (manganese oxide layer) 206a that includes manganese (FIG. 7(d)). Moreover, by this diffusion of manganese, the copper-manganese alloy layer 209 becomes a layer formed of copper, and is also unified and incorporated with a buried copper 210 on the copper-manganese alloy layer 209. Accordingly, the copper-manganese alloy layer 209 is changed into a new buried copper 207. In this way, the manganese oxide layer 206, 206a and the buried copper 207 are formed from the copper-manganese alloy layer 209 by heat treatment.

FIG. 8 shows formation steps of: a contact plug of the example 2. In FIG. 8, the same symbols are applied to the structural elements that are similar to the structural elements in FIG. 7.

In FIG. 8(a), a method for forming a contact plug by forming a copper manganese alloy at a contact hole is shown. Nickel is physical-vapor-deposited on a portion (n+Si layer) 202 where phosphorus density is excessive on the silicon substrate 201. The nickel is changed into a nickel silicide layer (metal silicide layer) 203 by heating. A silicon oxide layer as an insulating layer 204 is formed on the nickel silicide layer 203. A contact hole 205 is formed by a normal photo lithography method. The oxide layer 208 is formed by oxidization of the surface of the nickel silicide layer 203 at the bottom part of the contact hole 205 by applying a plasma oxidization method to the nickel silicide layer 203 (FIG. 8(a)).

After that, a copper-manganese alloy layer 209 is formed by depositing copper-manganese alloy on the nickel silicide layer 203 exposed at the bottom surface of the contact hole 205 and at the sidewall of the contact hole 205 by the chemical vapor deposition method (CVD method) (FIG. 8(b)).

For example, as a CVD precursor for forming the buried copper, (cyclopentadienly (triethylphosphine) copper (I)) is used, as a CVD precursor for forming the manganese layer, (bis(ethylcyclopentadienyl)manganese) is used. The silicon substrate 201 is placed in vacuum, and the silicon substrate 201 is heated to 450° C. The copper precursor and the manganese precursor are brought into contact with the surface of the substrate by using hydrogen gas as carrier gas. This causes to form a copper-manganese alloy of 10 nm thickness on the n+Si layer 202 of the silicon substrate 201, thereby forming the copper-manganese alloy layer 209 (FIG. 8(b)). At this time, a part of the manganese precursor is changed into an oxide that includes manganese by reacting with an oxide at the surface of the substrate. A flow rate of each precursor is adjusted so that manganese concentration of copper-manganese alloy layer 209 becomes atomic percent of 8%. After that, the inflow of the manganese precursor is stopped, while only the copper precursor is flown inwards, thereby filling the remainder of the contact hole 205. In this way, a buried copper 210 is formed (FIG. 8(C)).

The acquired sample is heat-treated in atmosphere containing oxygen of the oxygen partial pressure of $10^{-3}$ Pa for 30 minutes at 400° C. By such heat treatment, the manganese of the copper-manganese alloy layer 209 diffuses to the sidewall of the contact hole that is in contact with the insulating layer 204 and the interface with the oxide layer 208 that is formed on the surface of the substrate, thereby forming an oxide that includes manganese (manganese oxide layer) 206. The manganese of the copper manganese alloy layer 209 further diffuses to the surface of the buried copper 210, thereby forming an oxide that includes manganese (manganese oxide layer). Moreover, by this manganese diffusion, the copper-manganese alloy layer 209 changes into a layer composed of copper, and is unified and incorporated with the buried copper 210. Thus, the copper-manganese alloy layer 209 becomes a buried copper basically formed of pure copper. In this way, the manganese oxide layer 206, etc., and the buried copper 207 are formed from the copper-manganese alloy layer 209 by heat treatment.

After that, the manganese oxide that is formed on the surface of the buried copper 207 and an excessive part of copper that is formed on the surface of the insulating layer 204 are removed by chemical mechanical polishing (CMP), and the surface is cleaned, thereby forming a contact plug 200 (FIG. 8(d)). In this way, the contact plug that is composed of the nickel silicide layer 203, the manganese oxide layer 206 and the buried copper (contact plug body) 207 is formed. The contact resistance between the copper (Cu)—the manganese oxide layer—the nickel (Ni) silicide layer in this example was $1.89 \times 10^{-6}$ Ω·cm², where the contact plug with low contact resistance is realized.

Incidentally, in the example 2 mentioned above, the copper-manganese alloy layer is formed on the metal silicide layer and the sidewall of the contact hole, further, the buried copper is formed such that it is embedded inside the copper-manganese alloy layer. However, it is also possible that the complete inner part of the contact hole is filled with the copper-manganese alloy layer without forming the buried copper, thereafter applying heat treatment. By this method, the manufacturing processes can be simplified, and it is possible to easily manufacture the contact plug.

The electrode structure that is composed of the contact plug formed of copper (Cu) and the manganese oxide layer of the first embodiment of the present invention can be utilized for constituting an electrode of a solar battery and a flat panel display (FPD). Moreover, when forming these devices, it is possible to utilize the method for forming the contact plug formed of copper (Cu) in this invention.

Second Embodiment

A manganese oxide layer that constitutes a diffusion barrier layer of a second embodiment of the present invention is composed of two layers where the property of the internal part differs crystallographically or chemically. The second embodiment of the present invention will hereinafter be explained in detail.

Figure 9:
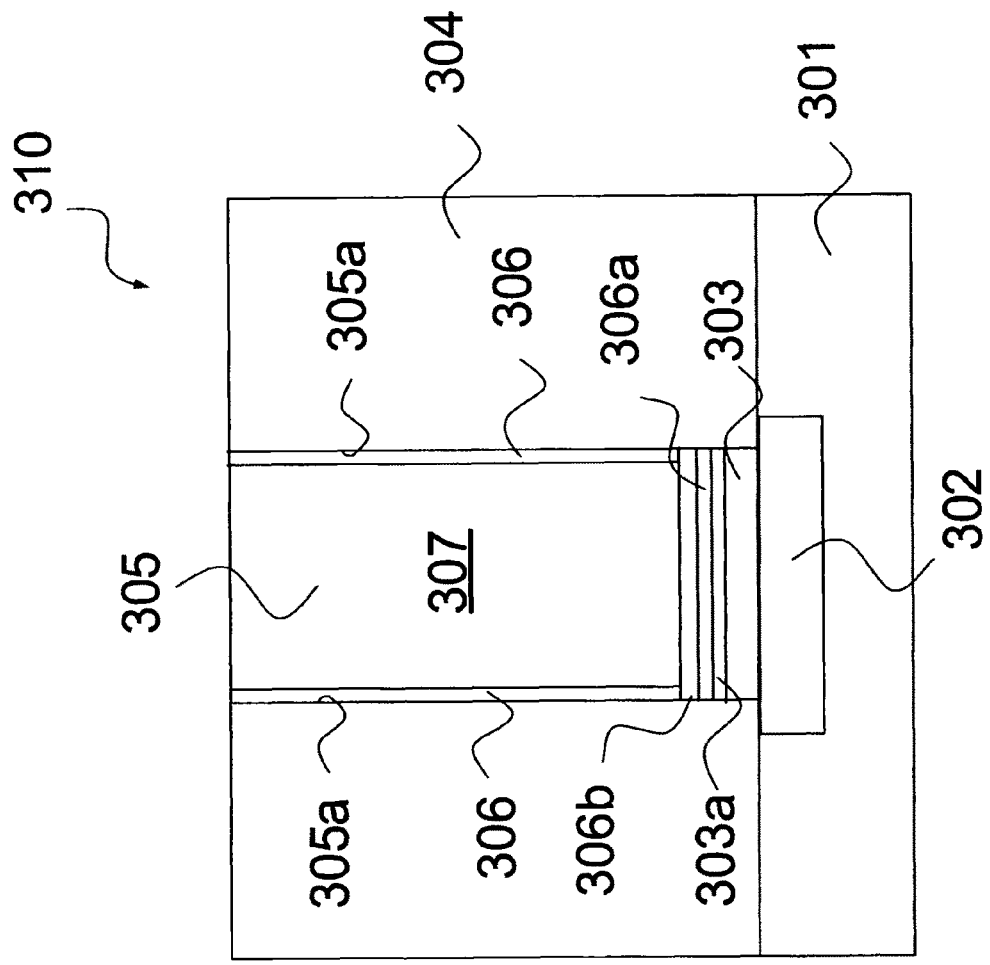
FIG. 9 shows a structure of a contact plug in the second embodiment.

FIG. 9 shows the contact plug in this embodiment. In the FIG. 9, contact plug 310 of this embodiment has the contact hole 305 formed in the insulating layer 304 of semiconductor device. The contact plug 310 further has the metal silicide 303 located at the bottom of the contact hole 305. The contact plug 310 has the first manganese oxide layer 306a formed on the metal silicide 303 in this contact hole 305. The first manganese oxide layer 306a is amorphous and includes silicon. The contact plug 310 further has the second manganese oxide layer 306b being amorphous and the first manganese oxide layer 306a including fine nanometer-sized crystals. The contact plug 310 has the buried copper 307 being formed on the second manganese oxide layer 306b and filling the contact hole 305.

The metal silicide layer 303 is formed on the silicon substrate 301 and an active region 302 of a transistor element. The surface part of the metal silicide layer 303 is oxidized and becomes the amorphous oxide layer 303a that mainly includes silicon. Moreover, the amorphous manganese oxide layer (sidewall manganese oxide layer) 306 is formed in the sidewall 305a of contact hole 305.

The first manganese oxide layer 306a and second manganese oxide layer 306b make up the diffusion barrier layer. The first manganese oxide layer 306a is amorphous and does not have a crystal grain boundary. Therefore, the first manganese oxide layer 306a has the mechanism to prevent interdiffusion between the metal silicide layer 303 and the copper 307 thorough the crystal grain boundary. The first manganese oxide layer 306a can effectively prevent penetration and diffusion of copper atom into metal silicide layer 303. Moreover, the second manganese oxide layer 306b includes fine crystals. By this fine crystal, the second manganese oxide layer 306b has the mechanism to increase conductivity by forming an area with low electric resistance internally. Therefore, the first and second manganese oxide layer 306a and 306b adequately exercise functions as a diffusion barrier layer for copper because of the synergetic effect of individual mechanisms. It is possible to contribute in forming a stable copper contact plug with low electric contact resistance for the metal silicide layer 303. The details of the contact plug 310 parts are explained below.

The metal silicide layer, for example, is formed in the active region of the transistor element that exercises source, drain, or gate functions which are formed as the actual amorphous silicon (a-Si) semiconductor on the glass substrate. Moreover, the metal silicide layer is formed as an electrode in the active region of the transistor element made of semiconductor materials like silicon or silicon germanium (SiGe). The metal silicide is a compound of silicon (Si) with metallic elements such as cobalt (element symbol: Co), titanium (element symbol: Ti), nickel (element symbol: Ni), tungsten (element symbol: W), magnesium (element symbol: Mg), platinum (element symbol: Pt), hafnium (element symbol: HO), molybdenum (element symbol: Mo), tantalum (Ta), vanadium (element symbol: V), niobium (element symbol: Nb), chrome (element symbol: Cr), zirconium (element symbol: Zr), palladium (element symbol: Pd), rhodium (element symbol: Rh), iron (element symbol: Fe), tin (element symbol: Sn), etc.

Benefits of this example are (1) good adhesiveness with semiconductor silicon formed in the active region of transistor elements, (2) good Ohmic contact characteristics with semiconductor silicon, and (3) good oxidation-resistance also with manganese oxide layer. Therefore, in terms of electric characteristics, a better approach is to choose the metal silicide layer from one or two more types of cobalt, titanium, nickel or tungsten. In this example, the silicide layer of nickel or cobalt is used because those have especially beneficial results among other metals. The composition formula of nickel silicide layer is for example, $Ni_2Si$, $NiSi$, $NiSi_2$ or $Ni_3Si_2$. Moreover, in this example, even if the silicide layer includes both nickel and cobalt, based on the increase or decrease in contained amount of nickel or cobalt, as a matter of convenience, if the contained amount of nickel is larger than others, it is called nickel silicide layer and conversely if the contained amount of cobalt is larger than others then it is called cobalt silicide layer in this specification.

Some technical methods are required for forming the metal silicide layer of nickel or cobalt in the active region of transistor elements. For instance, (a) the method of physical vapor deposition (PVD) method like sputtering with silicide targets including nickel silicide or cobalt silicide, (b) the silicide layer forming method of the reacting (silicidation) with the semiconductor silicon in the active region of transistor elements after forming the metal layer for the silicide layer by PVD methods like vacuum vapor adhesion method or electron beam vapor deposition method with the vapor deposition source or the metal target of highly pure nickel or cobalt, or (c) the silicide layer forming methods of the reacting (silicidation) with the semiconductor silicon in the active region of transistor elements after forming the metal layer for the silicide layer by the chemical gas vapor deposition method (CVD) with thermal decomposition of source materials that include nickel or cobalt, for example, materials of alicyclic compounds like carbonyl compound or cyclopentadienyl compound.

In the manufacturing of nickel layer using the metal organic precursor pyrolysis method that is a type of CVD method mentioned above in (c), it makes possible to use, for instance, carbonyl nickel (molecular formula: $Ni(CO)_4$) or bis (1,5-cyclooctatetraene)nickel (molecular formula: $(1,5-C_8H_{12})_2Ni$). Moreover, examples of materials for forming the cobalt layer are, for instance, cobalt octacarbonyl (molecular formula: $Co_2(CO)_8$) or (cyclopentadieny)cobalt dicarbonyl (molecular formula: $C_5H_5Co(CO)_2$). These materials are deposited by atom layer deposition (ALD) therefore, can also be used as nickel or cobalt material to manufacture the nickel or cobalt.

The density distributions of silicon atoms and metal atoms in the metal silicide layer formed by the sputtering method with the metal silicide target are kept constant density distributions in direction of thickness of layer. The metal silicide layer where the metal atoms and silicon atoms are distributed at almost constant density in the direction of depth (direction of thickness of layer), can be validly used as the source electrode or drain electrode. However, active region of transistor elements that consist of semiconductor silicon can be joined securely; and also, it is necessary that the metal atoms and silicon atoms have a specific distribution as described later in the metal silicide layer for forming by adhering to the double layer structure manganese oxide layer related to this invention. As a result, in this example, the material forming method of metal coating that forms the metal silicide is better method than the sputtering method that targets metal silicide as the metal silicide layer is used.

Heat treatment is applied to the metal coating and converted to metal silicide layer by chemical combination with semiconductor silicon. The heat treatment is ideally to be implemented after the metal coating is kept remaining limited to the active region of transistor elements. To limit the residue of metal coating only to the active region of transistor elements, for instance, the conventional photolithography technology to remove the metal coating existing in areas other than the active region of transistor elements by selective etching after forming the metal coating on the complete surface of the silicon substrate having the active region of transistor elements. To implement this method, it is possible to use exposure technology that takes electron beam lithography method or ultraviolet as light source. Otherwise, there is a method to deposit selectively using the mask material to coat the metal in the active region of transistor elements. In any case, favorable method is to implement heat treatment after locating the metal coating only in the active region of transistor elements. If not, potential problems may occur while the manufacturing the transistor elements of low power consumption and integrated circuit formed from those element because of unnecessary current leakage of element operating current provided from the copper contact plug. This problem happens when unnecessary metal silicide layers are formed by reacting between metal and silicon even in areas other than the active region of elements where metal silicide layer is not necessary.

For example, in forming the nickel silicide layer by silicidation of nickel, heat treatment is preferred at 800° C. or lesser in vacuum or inactive gas atmosphere. If heat treatment is applied at more than 800° C., potential problems may occur while exercising functions of elements because of notable diffusion elements of nickel into the active region even if the complete nickel layer can be converted to nickel silicide. On the other hand, if the heat treatment is applied at approximately 300° C. or lesser, the complete nickel layer will not be converted to nickel silicide and un-reacted nickel will remain on the surface part of nickel layer. Therefore, as described later, it will not be possible to achieve a nickel silicide layer with appropriate density distribution that has reduced atom density of nickel consisting of chemical bonding of silicon in direction of surface from bonded interface with active region of elements as regulated in this example. Conditions for applying heat treatment in cobalt coating, are same as case of nickel coating.

In this example, the density of atoms of metal that forms the metal silicide layer chemically bonded with silicon is decreased in the direction of increase in thickness of layer, for instance, the metal silicide layer reducing the density of cobalt atoms, is ideally taken as under layer and a double structure manganese oxide layer formed over it. The direction of increase of layer thickness refers to the direction towards the surface from the bonded interface of the active region of elements made of semiconductor silicon of metal silicide layer. The reason why the metal silicide layer with such distribution of atoms of metal is used because the zygosity of element operation area formed of semiconductor silicon will be superior and secure adhesion with diffusion barrier layer made of manganese oxide will also be possible.

Figure 10:
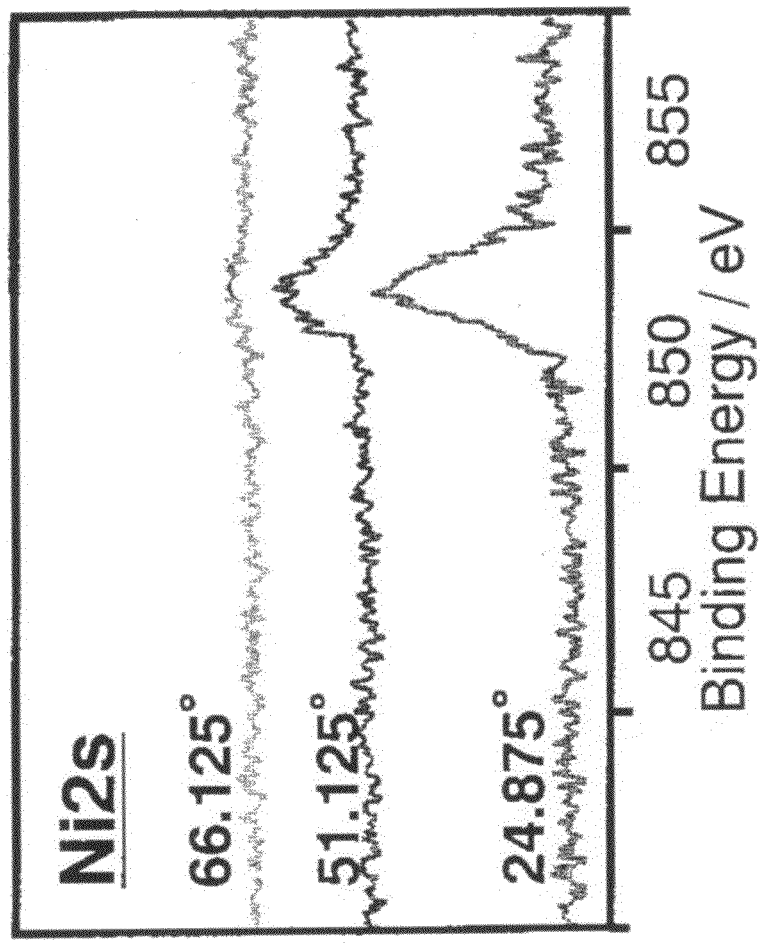
FIG. 10 shows results of analysis of chemical bonding status of the nickel silicide layer.

Increase or decrease in density of atoms of metal in metal silicide layer bonded chemically with silicon is exploration using the analysis method like X-ray Photoelectron Spectroscopy (XPS). FIG. 10 shows a result of XPS analysis for incidence beam angle method of nickel silicide layer formed by heat treatments for adhesion on the silicon substrate. It provides information of the status of bonding in deep part of metal silicide layer close to silicon when the angle of incidence beam is low. The vertical axis in FIG. 10 shows one angle of incidence beam for strength of photoelectron measures corresponding to the given chemical bonding and it shows that the density of atom of chemical bonding that consists of nickel is high. As shown in FIG. 10, the strength caused by the chemical bonding of silicon and nickel becomes higher if incidence beam angles are lower, in other words, deeper in the portion of the metal silicide layer makes the strength caused by the chemical bonding of silicon and nickel higher. Therefore, the density of atom of nickel chemically bonded with silicon reduces in the direction of increase of thickness of nickel silicide layer.

It is obviously necessary to apply heat treatment at the temperature range applicable for silicidation of metal coating for the metal silicide layer that has such atom density. In addition, by limiting the temperature for applying heat treatment to coat the metal to a narrow range from 450° C. to 550° C., it is possible to form a metal silicide layer with distribution of atom density mentioned above more effectively and stably.

The time for applying heat treatment for coating of metal is suitable between 1.5 to 3 hours. If the heat treatment time becomes less than 1.5 hours, then it is difficult to stably form the metal silicide layer with reduced density of metal atoms chemically bonded with silicon. On the other hand, if the heat treatment becomes more than 3 hours as a long heat treatment, the metal elements formed by the metal silicide layer existing around the bonded interface with the active region of elements will diffuse internally in the active region of elements and the probability of migration. Therefore, problems of inhibition effect to exercise its functional capability of the transistor elements may occur in that case.

The favorable approach for the diffusion barrier layer formed by double layer structure of manganese oxide layer related to this example is to form the oxide layer of silicon that forms the surface part of the metal silicide layer by oxidization of surface of metal silicide layer and then forms the manganese oxide layer. The favorable approach for the manganese oxide layer is the method that the surface of metal silicide layer is exposed to plasma oxide to oxidize silicon formed the surface part of that layer, the oxide layer included silicon is processed, and then it is formed on the oxide layer. The oxide layer formed by oxidizing the metal silicide layer is preferred as more amorphous compared to the single crystal or polycrystal. The amorphous oxide layer can be formed by applying and adjusting the conditions for oxidization of surface of metal silicide layer. An example can be given when the nickel silicide layer is taken as metal silicide layer and the conditions for oxidization of that surface are less than 100° C. temperature, 40 pascal pressure (Unit: Pa), high-frequency power of 100 watts (Unit: W) and exposing to plasma oxidation for 30 minutes in the reduced atmosphere environment.

It is favorable outcome that the oxide layer formed in the surface part of the metal silicide layer is an amorphous layer with no crystal grain boundary. The reason for favorable outcome is that an amorphous layer can reduce the magnitude of current leaking of the transistor element through the crystal grain boundary. Thus, in this example it is possible to form the contact plug of copper that has low copper operating current and it makes possible to forcefully contribute to forming the low power consumption elements and integrated circuits having the transistor elements. On the other hand, the resistivity of amorphous oxide is generally higher than the oxide of crystal configuration. Therefore, if the oxide layer is excessive then it becomes an impediment to achieve a copper contact plug with low electric contact resistance. If the oxide layer is formed by the plasma oxidization method with plasma oxide in the surface of the metal silicide layer surface then the thickness of the oxide layer increases proportionally to the square root of the time of oxidization of plasma but the thickness of the oxide layer is favorably less than 1.5 nm. In addition, more favorably, it should be less than 1 nm. On the other hand, it is necessary that the thickness of oxide layer is more than 0.5 nm to form the manganese oxide layer including silicon. Thickness of the oxide layer can be measured, for example, with the transmission electron microscope (TEM).

Moreover, to use the manganese oxide layer that makes the diffusion barrier layer through the oxide layer formed in the metal silicide layer, makes it possible to form the manganese oxide layer that is adhered securely. In addition, the silicon in the surface part is consumed to form a chemical bond with the oxide (element symbol: O) for forming the oxide layer, therefore, in the surface part of the metal silicide layer, it is possible to reduce the amount of silicon atom used for chemical bonding with atom of metal in metal silicide layer consists. That is, in other words, the amount of metal atoms consisting of the metal silicide layer having a chemical bonding with the silicon atom ideally reduce in the direction of the surface part of the metal silicide layer and as described earlier, it is possible to provide with the advantages of accelerating achievement of distribution of density of metal atoms in this embodiment.

In this example, the diffusion barrier layer formed on the metal silicide layer is composed of a double layer structure of the first and second manganese oxide layer where the organization structure varies chemically. The double layer structure has the first manganese oxide layer being a layer formed of the metal silicide layer or above the oxide layer formed in the metal silicide layer. The second manganese oxide layer is a layer formed on the first manganese oxide layer located on the copper contact plug side. The first or second manganese oxide layer having manganese oxide means, for instance, manganese monoxide (composition formula: MnO), manganese dioxide (composition formula: MnO2), di-manganese trioxide (composition formula: Mn2O3), and tri-manganese tetroxide (composition formula: Mn3O4). Moreover, the first or second manganese oxide layer having manganese oxide means, manganese oxides include silicon. The manganese oxide structure can be adjusted by analysis of bonding energy of manganese and oxide using X-ray photoelectron spectroscopy. Or, it is possible to know the results of structure analysis using the energy dispersive X-ray spectroscopic analysis (EDX).

The first and second manganese oxide layer can be formed using any of the technology methods. One example is to form the manganese layer on the metal silicide layer, and thereafter, form the manganese oxide layer by oxidizing that manganese layer. For instance, bis(ethylcyclopentadienyl)manganese (molecular formula: $(C_2H_5C_5H_5)_2Mn$) is taken as the manganese material and the manganese layer that is made by the chemical vapor deposition method with hydrogen gas (molecular formula: $H_2$) as a carrier gas. The advantage of this method is that the manganese oxide layer is easily formed on the metal silicide layer or the oxide layer formed in the surface part of the layer with large surface coverage.

In the chemical gas vapor deposition method, it is favorable environment that the temperature when forming the manganese layer on the nickel silicide layer with a structure of for example $Ni_2Si$, NiSi, $NiSi_2$, and $Ni_3Si_2$ is more than 100° C. but less than 400° C. At lower temperatures than 100° C., it will not be possible to form a uniform manganese oxide layer above the metal silicide layer. On the other hand, if temperatures are more than 400° C., then the manganese layer will include large amount of carbon (element symbol: C) that causes thermal decomposition of hydrocarbon added mainly to the chemical compounds of material. Therefore, the consequence may be the disadvantage of manganese oxide layer with inferior adhesiveness metal silicide layer.

Another method is the physical vapor deposition. For instance, the another method is to form the manganese oxide layer by oxidizing the layer formed after making the manganese layer by the high frequency wave sputtering method. It is favorable choice that the target for sputtering of manganese is used with highly pure manganese. Specially, it is more favorable way that there are no contained elements where the formation of enthalpy of oxide is lower than manganese, or that the manganese is highly pure like the manganese contained amount is higher than 99.999% (=5N). If such highly pure manganese target is chosen, then it makes possible to get manganese oxide layer with low contained amount of metal impurities that causes leakage in copper operating current.

Moreover, there is another choice, for example, to take the manganese oxide as the target and form the manganese oxide layer on the metal silicide layer. The advantage in this method is that the operation to oxidize the manganese layer is unnecessary to form the manganese oxide layer. Furthermore, another advantage is that if manganese oxide with differing structures is used then it makes possible to form a manganese oxide layer with differing structures corresponding to the variance in structure of the manganese oxide. For instance, first, target formed from manganese dioxide ($MnO_2$) is used and the first manganese layer composed of manganese dioxide ($MnO_2$) and then the target made of manganese monoxide (MnO) is chosen and the second manganese oxide layer is formed of manganese monoxide.

The first manganese oxide layer is composed of amorphous manganese oxide layer. By forming the first manganese oxide layer, specially, of an amorphous layer with no crystal grain boundaries, it makes possible to avoid an electrical short circuit and a current leakage in the active region of transistor elements like a gate region. Therefore, it is possible to stabilize and provide elements for forming the integrated circuits that exercises normal gate action with superior pinch off characteristics. To get an amorphous manganese oxide layer without depending on the method for forming the first manganese layer like chemical gas vapor deposition method or physical vapor deposition method, good way is to manufacture the manganese layer or manganese oxide layer at low temperatures as described above as examples of methods for forming the manganese oxide layer. Moreover, in this embodiment, the oxide layer formed by oxidizing the metal silicide layer is an amorphous layer; therefore, it can contribute in forming the amorphous first manganese oxide layer.

Here, the first manganese oxide layer includes silicon and this point is described later.

The second manganese oxide layer is formed of amorphous manganese oxide layer that includes fine crystals. Amorphous layer including fine crystals means the amorphous layer that exists in the area where a part of the area is crystallized. And, fine crystals grains are positionally mixed irregularly. TWhether it is amorphous or not, the existence of crystal grains or the existence of crystallized area in the amorphous layer can be ascertained by cross section TEM inspection by the transmission electron microscope (TEM).

Figure 11:
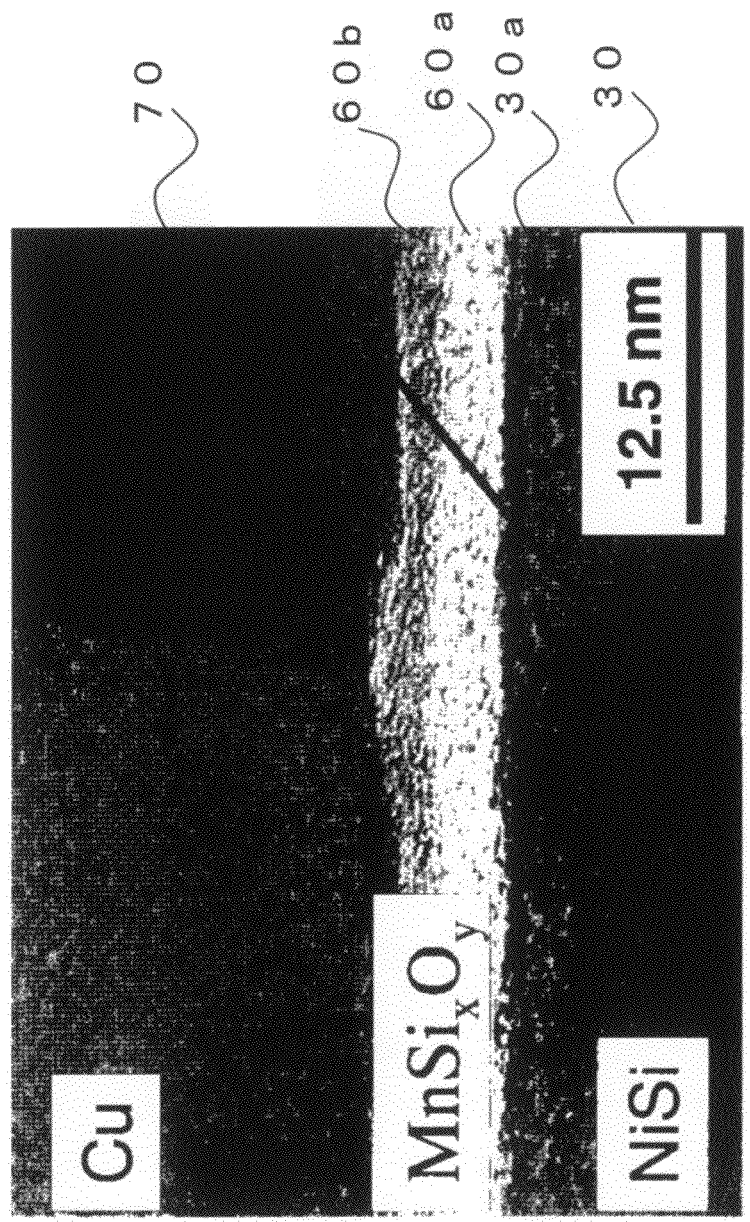
FIG. 11 is a cross section TEM image that shows an example of the double layer structure diffusion barrier layer formed of the first and the second manganese oxide layer.

FIG. 11 is a cross section image showing an example of the diffusion barrier layer as the double layer structure composed of the first and second manganese oxide layers. The diffusion barrier layer is made of the first manganese oxide layer 60a and the second manganese oxide layer 60b in the surface part of nickel silicide layer 30 and buried copper 70 formed by copper is formed on the second manganese oxide layer 60b.

The crystallized area is not visible in the first manganese oxide layer 60a and this first manganese oxide layer 60a can be judged as an amorphous layer. On the other hand, the second manganese oxide layer 60b is mostly amorphous but a part of the area is determined as the part where the atom array is regular. That is, the crystallized area 61b exists in the part of the area inside. Therefore, the second manganese oxide layer 60b can be determined to be amorphous that includes the crystallized area 61b.

If the second manganese oxide layer is made of an amorphous layer including fine crystals then there will be a crystallized area with low electric resistance. Therefore, the functions as the diffusion barrier layer for the copper are exercised adequately and it makes possible for the metal silicide layer to contribute to forming the copper contact plug with low electric contact resistance. Concrete examples based on actual results by this invention shows that if the buried copper (layer thickness=100 nm) that takes for example tantalum (layer thickness=10 nm) as the diffusion barrier layer on the nickel silicide layer, then the contact resistance at ambient temperature is $1.52 \times 10^{-5}$ $\Omega/cm^2$. As a consequence, the diffusion barrier layer formed on the nickel silicide layer is composed of the manganese oxide layer of double layer structure in this example.

Example

Example 3

The present invention is explained with an example of a case, in which the metal silicide layer is a nickel silicide layer, and a copper contact plug is formed through a diffusion barrier layer composed of double-layer-structured manganese oxide layer.

Figure 12A:
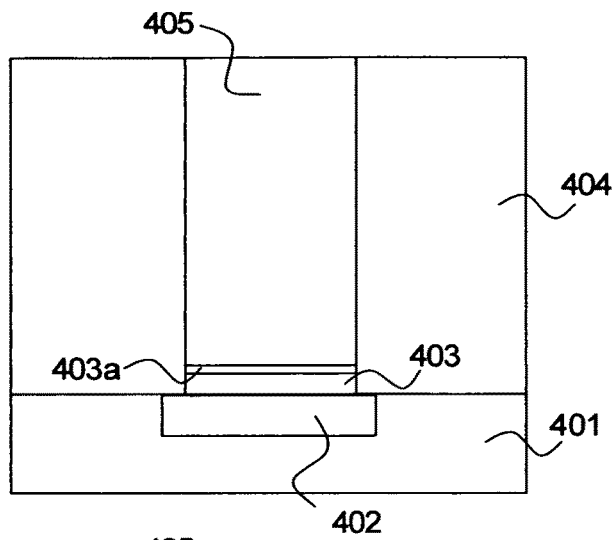
FIGS. 12(a)-12(c) are schematic figures that explain the method to form the contact plug described in an example 3.
Figure 12B:
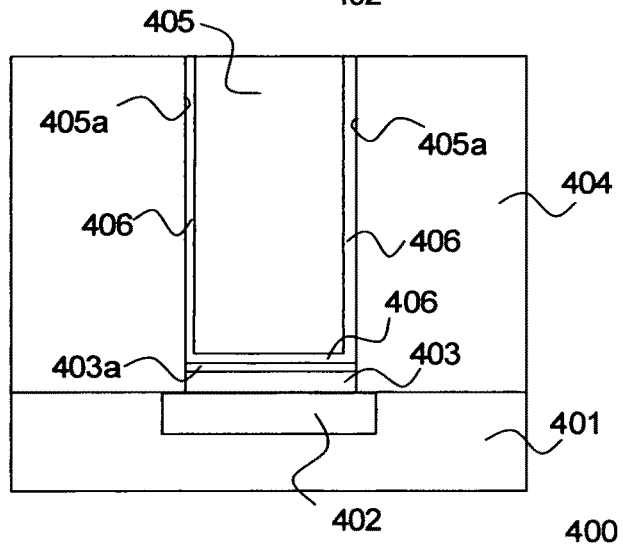
Figure 12C:
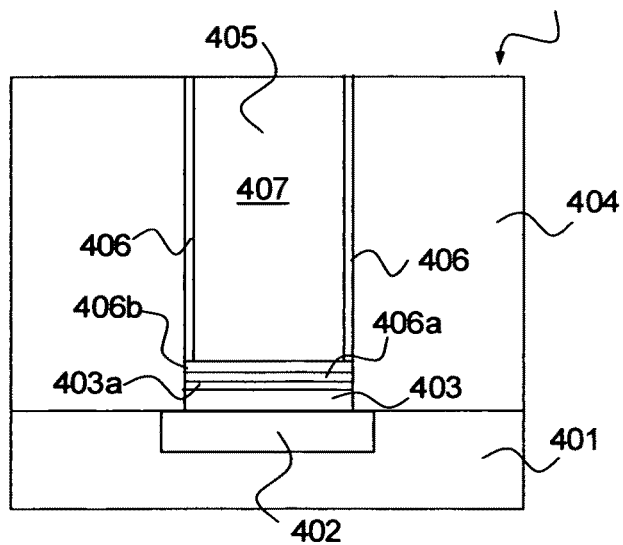
Figure 13:
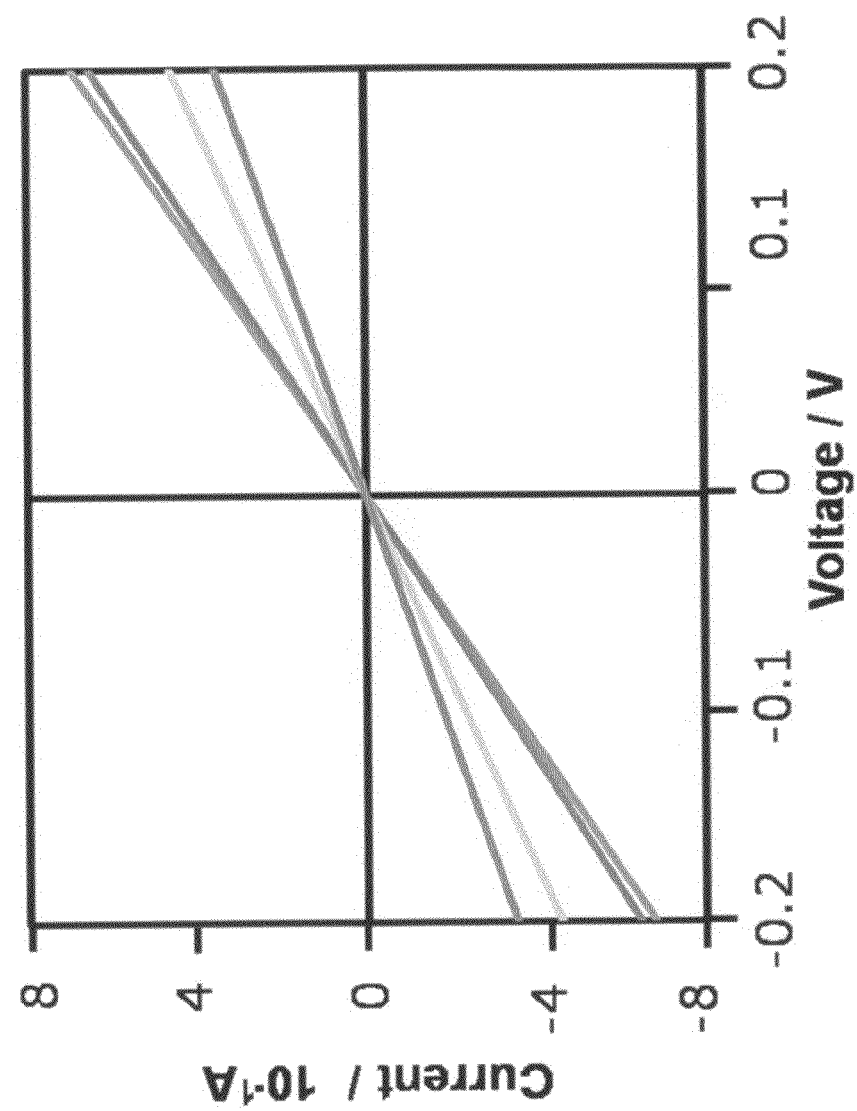
FIG. 13 is a figure that shows the result of TLM measurements of electric current-voltage characteristic between the nickel silicide layer and contact.
Figure 14:
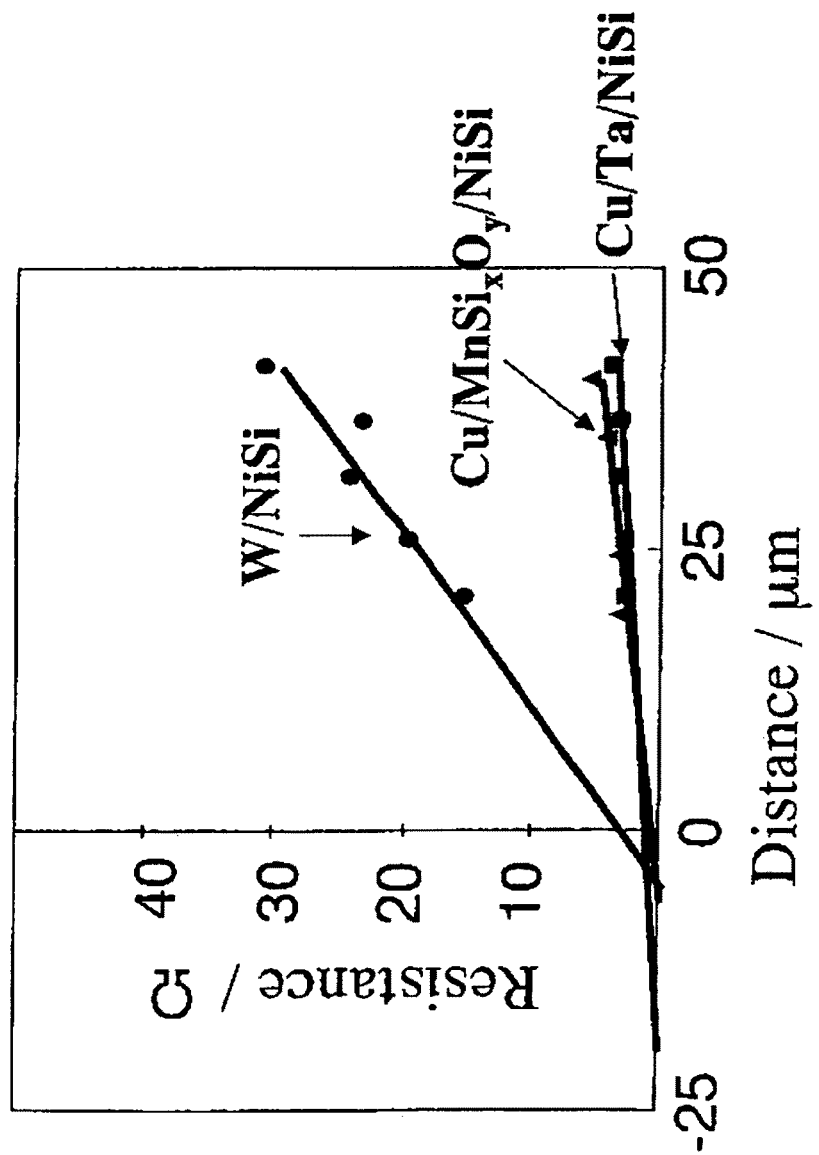
FIG. 14 is a figure that shows the electrode distances and values of electrode resistances related to each contact plug in the example 3, a comparative example 1 and a comparative example 2.

FIGS. 12(a)-12(c) are schematic diagrams to explain a method of forming a copper contact plug over nickel silicide layer through a diffusion barrier layer composed of double-layer-structured manganese oxide layer. FIG. 13 shows a result of current-voltage characteristics between the nickel silicide layer and the contact plug made of copper. The current-voltage characteristic was measured by TLM method. FIG. 14 shows a relationship of distance and resistance between electrodes, regarding the plug structure described in the example 3, comparative example 1 and comparative example 2.

First, nickel coating was formed for forming the metal silicide layer 403 on the whole surface of the silicon substrate 401 (refer to FIG. 12(a)), which contains the active region 402 of the transistor element, which is an n-type conductive element with a large carrier concentration. The thickness of the nickel coating was set as 3 nm. Next, the nickel coating was made remain only in the active region 402 of the transistor element by conventional photolithography and etching technique.

Next, the remaining nickel coating was heated at 460° C. for 2 hours in inert gas atmosphere composed of argon to form the nickel silicide layer. Thereby, the nickel silicide layer 403 was formed only on the active region 402 of the transistor element.

Next, a silicon dioxide ($SiO_2$) insulating layer 404 was formed such that it once coated the active region of transistor element 402 and the nickel silicide layer 403. After that, the $SiO_2$ insulating layer 404 over the nickel silicide layer 403 was removed by etching. As a result, as shown in FIG. 12(a), a via hole (contact hole) 405 was formed. In the bottom of the via hole 405, the nickel silicide layer 403 was exposed. The width of the opening of this via hole 405 for contact was 45 nm.

Next, the surface of the nickel silicide layer 403 was oxidized by oxidizing plasma. The oxidizing plasma was generated by applying 40 kHz of high frequency wave in oxygen gas with 100 W output. By this oxidation process, an amorphous oxide layer 403a, which mainly contained silicon in an area from a surface of the nickel silicide layer 403 to approximately 1 nm deep, was formed. However, because the layer was too thin and its thickness was approximately 1 nm, it was not possible to confirm whether the amorphous oxide layer 403a contained silicon oxide.

Next, an amorphous manganese oxide layer 406 was formed on the surface of the nickel silicide layer 403, on which the oxide layer 403a was formed, at 200° C. by chemical vapor deposition (CVD) method with bisethylcyclopentadienyl manganese (($C_2H_5C_5H_5)_2Mn$) as a manganese material (Refer to FIG. 12(b)). The thickness of the manganese oxide layer 406 was set as 3.4 nm. Moreover, this manganese oxide layer 406 was formed not only in the bottom part of the via hole but also such that it covered the surface of the sidewall 405a of the via hole 405. (Refer to FIG. 12(b)).

Next, the manganese oxide layer 406 was heated at 460° C. for 2 hours under the oxygen partial pressure of $1\times10^{-3}$ Pa. As a result a first manganese oxide layer 406a, which contained silicon and which was composed of trivalent manganese, was formed on the oxide layer 403a side of the nickel silicide layer 403. In addition, a second manganese oxide layer 406b containing manganese monoxide (composition formula: MnO), which was made of divalent manganese, was also formed in the surface part of the manganese oxide layer 406. The thickness of the first manganese oxide layer 406a was 1.8 nm and the thickness of the second manganese oxide layer 406b was 1.6 nm. (Refer to FIG. 12(c)).

After heating the manganese oxide layer 406, the concentration distribution of nickel atom, which forms chemical bonds to silicon, in the nickel silicide layer 403 was investigated by X-ray photoelectron spectroscopy (XPS) method. The result was that the concentration of the nickel atom chemically bonded to silicon (Si) in the nickel silicide layer 403 was reduced gradually in the direction as the layer thickness increased.

Next, on the second manganese oxide layer 406b, copper was deposited by physical vapor deposition method so that it filled the via hole 405, and the buried copper 407 with 100 nm of layer thickness was formed. The buried copper 407 corresponds to the copper contact plug body 407 (Refer to FIG. 5(c)). Thereby, the contact plug 400, composed of the nickel silicide layer 403, the diffusion barrier layer containing the double-layer-structured manganese oxide layers 406a and 406b, and the buried copper (contact plug body) 407, were formed.

Separately, using the same method as described in this example, the nickel silicide layer, the double-layer-structured manganese oxide layer, and the buried copper were formed on a silicon substrate. By TLM method, contact resistance between copper constituting the contact plug and the metal silicide layer across the diffusion barrier layer composed of double-layer-structured manganese oxide was measured.

FIG. 13 shows the current-voltage relationships between the two electrode pads when the distance between the electrode pads was changed from 19 μm to 40 μm. It shows that all the relationships were linear in any distance and that Ohmic characteristics were obtained.

FIG. 14 shows the results of plotting the distance between the electrode pads to the resistance value obtained from the linear relationship in FIG. 13. Contact resistance was obtained from intercept values of both X axis and Y axis in this figure. This contact resistance was $1.93\times10^{-6}$ $\Omega/cm^2$. FIG. 14 also shows the results of two other examples. The other two examples were explained below as comparative examples 1 and 2.

Comparative Example 1

A nickel silicide layer was formed on a silicon substrate using a nickel coating as a start material and by the method described in the example 3. Then a plug layer (layer thickness=100 nm) made of tungsten was formed on the nickel silicide layer. Using the TLM method as explained in the example 3, contact resistance between tungsten forming the contact plug and the nickel silicide layer was measured. As a result, regardless of absence of oxide layer where nickel silicide layer was oxidized, and moreover, regardless of absence of the diffusion barrier layer made of double-layer-structured manganese oxide layer, the obtained contact resistance was $2.23\times10^{-6}$ $\Omega/cm^2$, which was higher than the contact plug containing the elements of the present invention.

Comparative Example 2

A nickel silicide layer is formed by the method described in the example 3, using a nickel coating on a silicon substrate as a start material. Then a single layer of tantalum (layer thickness=10 nm) was formed on the nickel silicide layer as a diffusion barrier layer. Next, a buried copper (layer thickness=100 nm) was formed on the diffusion barrier layer made of tantalum as the plug layer. Using the TLM method as mentioned in the example 3, contact resistance between copper forming the contact plug and the nickel silicide layer was measured. The result was that when the diffusion barrier layer was constituted with tantalum layer, the obtained contact resistance was $1.52\times10^{-5}$ $\Omega/cm^2$, which was eight times larger than that of the copper contact plug in the present invention.

Example 4

Based on FIGS. 15, 16, and 17, a method of forming the copper contact plug is explained, utilizing a convenient method of forming a buried copper and a diffusion barrier layer, composed of first and second manganese oxide layers, altogether, using a copper-manganese alloy layer.

FIGS. 15(a)-15(d) are schematic diagrams that show the method of forming the first and second manganese oxide layers and the buried copper altogether by applying heat treatment to the copper-manganese alloy layer.

Figure 15A:
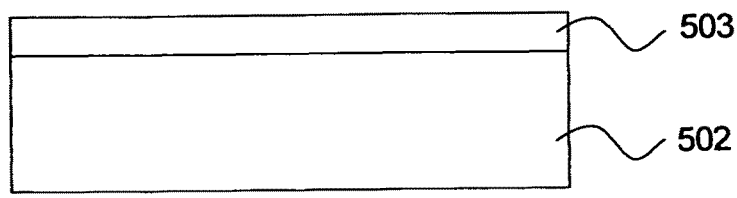
FIGS. 15(a)-15(d) are figures that explain the method for forming the contact plug in an example 4.
Figure 15B:
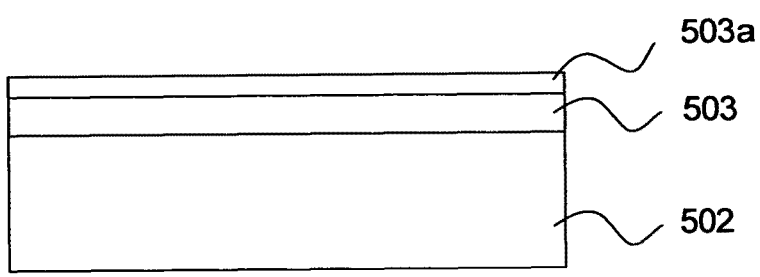
Figure 15C:
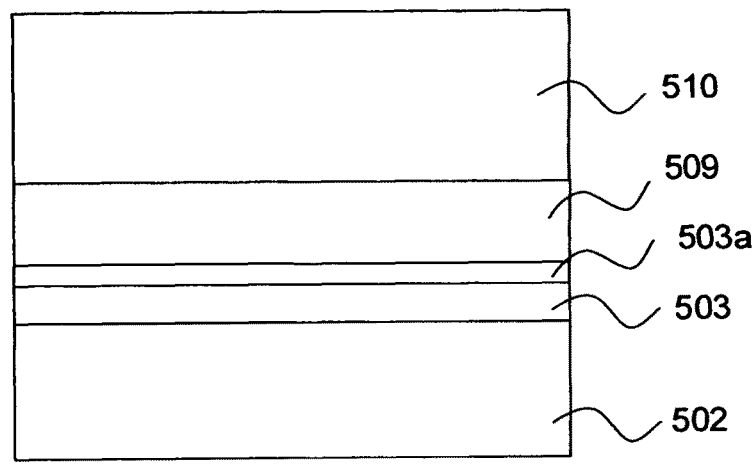
Figure 15D:
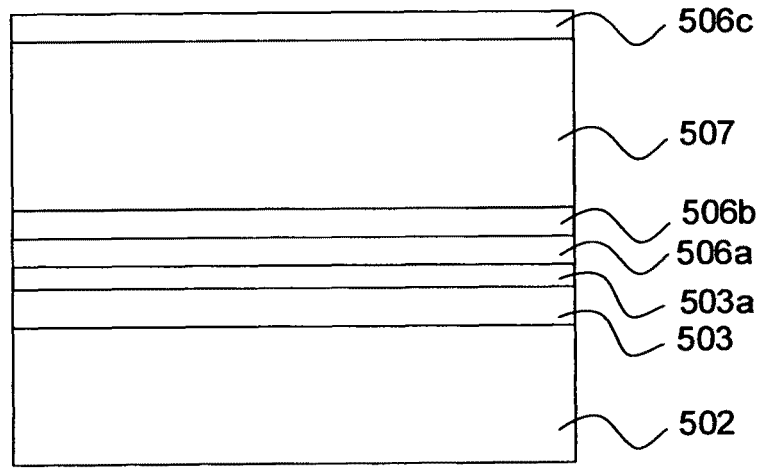

FIG. 15(a) shows a substrate as a silicon layer 502 for forming the copper-manganese alloy layer. 10 nm thickness of a cobalt layer was formed on the silicon layer 502 by high frequency sputtering method. Then, the cobalt silicide layer 503 was formed by heating at 480° C. for 2.5 hours in vacuum. A plasma oxidation process was performed for this sample. Plasma oxidation was performed at 100 W output with 40 kHz of high frequency wave at 40 Pa of oxygen gas pressure at ambient temperature for 10 minutes. By this process, the surface of the cobalt suicide layer 503 was oxidized and an amorphous oxide layer 503a mainly containing silicon was formed on the surface. (FIG. 15(b)).

30 nm thickness of a copper-manganese alloy layer was formed on this oxide layer 503a by high frequency sputtering method. Then, 100 nm thickness of a buried copper 510 was formed by high frequency sputtering method, using highly pure copper as a target material (FIG. 15(c)). Heat treatment was applied to this obtained sample in an oxygen-containing atmosphere at $10^{-2}$ Pa of oxygen partial pressure at 480° C. for 2.5 hours. By this heat treatment, manganese in the copper-manganese alloy layer 509 diffused towards the interface of the oxide layer 503a, and first and second manganese oxide layers 506a and 506b that contained manganese was formed. Moreover, the manganese diffused toward the surface of the buried copper 510, and a manganese oxide layer (surface-side manganese oxide layer) 506c was formed (FIG. 15(d)). Moreover, the copper-manganese alloy layer 509 became a layer made of copper by this manganese diffusion, and it also became a new buried copper 507, uniting with the buried copper 510 on it. By applying the heat treatment, the first and second manganese oxide layers 506a, 506b, the surface-side manganese oxide layer 506c, and the buried copper 507 were formed from the copper-manganese alloy layer 509.

Figure 16A:
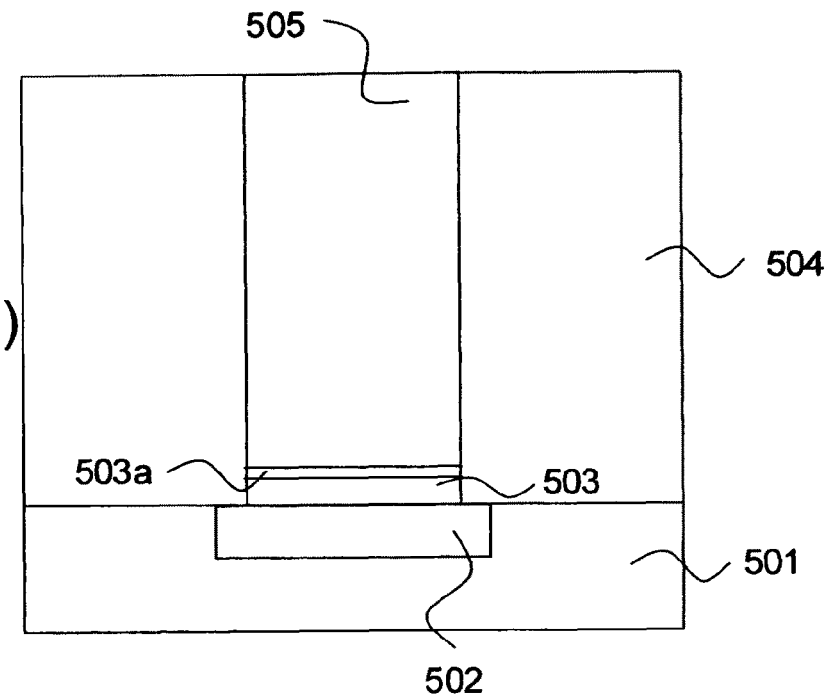
Figure 16B:
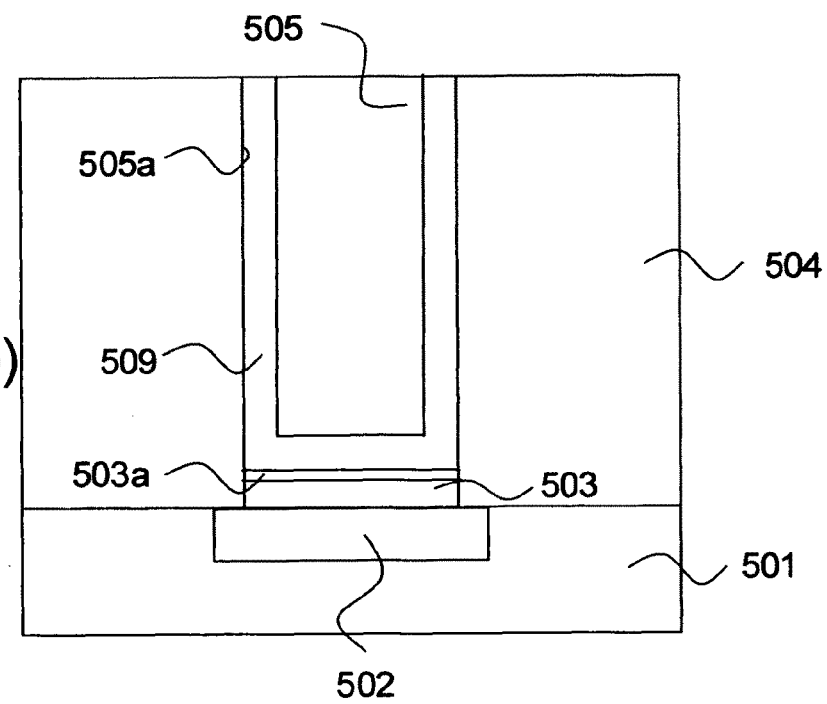
Figure 17C:
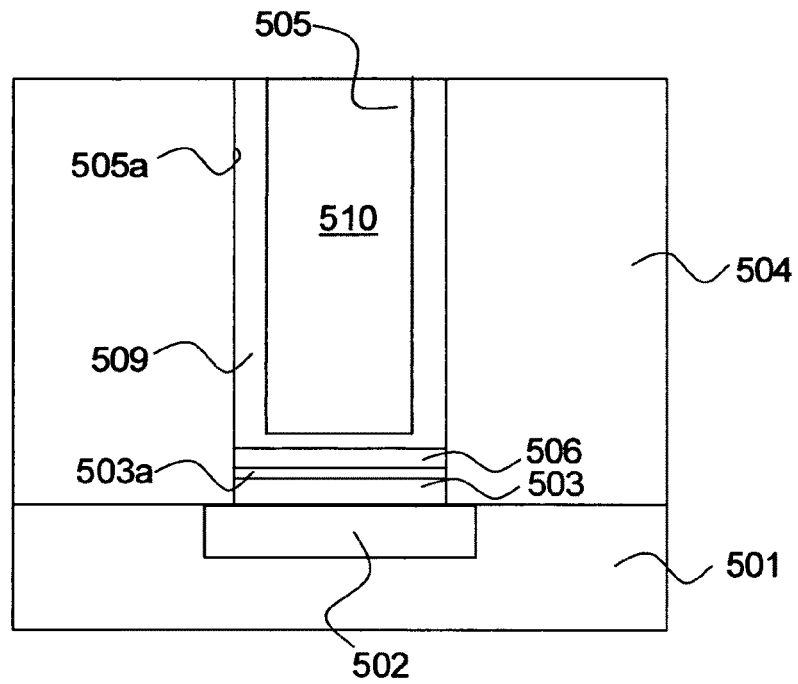
FIGS. 17(c)-17(d) are figures that explain the second half of the method to form the contact plug in the example 2.
Figure 17D:
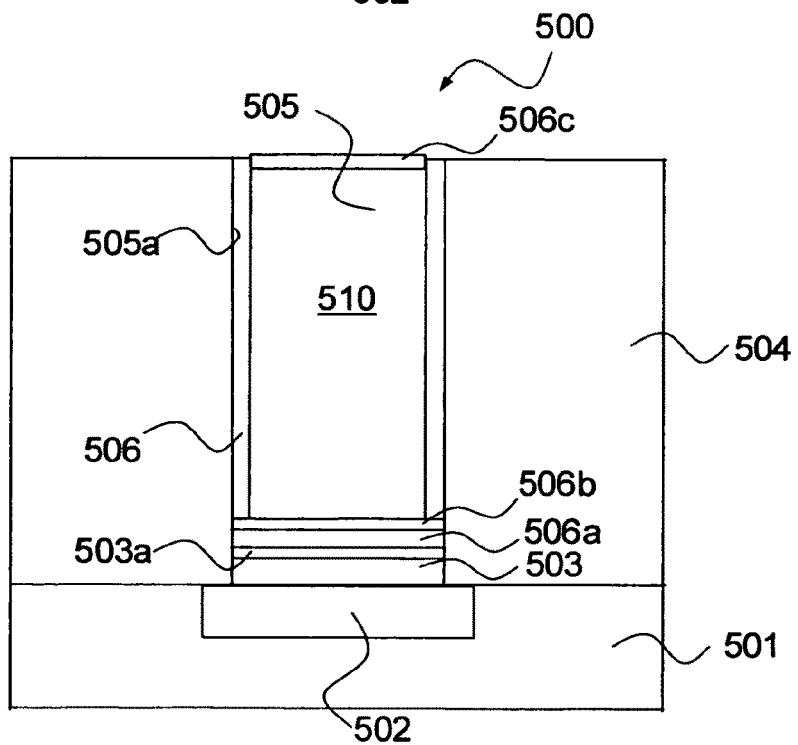

FIGS. 16(a)-16(d) and 17(c)-17(d) show a method for forming a contact plug of the example 4. FIGS. 16(a)-16(b) show the first half of the forming method and FIGS. 17(c)-17(d) show the second half of the forming method. In FIGS. 16(a)-16(b) and 17(c)-17(d), the same numbers are used for the elements that are same as those in FIGS. 15(a)-15(d).

FIGS. 16(a)-16(b) and 17(c)-17(d) show a method for forming a copper plug by forming a copper-manganese alloy layer in a via hole for contact. As shown in FIG. 16(a), first, a cobalt layer was formed in a high carrier density area (shown as "n+Si layer" in the figure) on a silicon substrate 501. Then, heat was applied and a cobalt silicide layer 503 was formed. On this layer, silicon oxide was formed as an insulating layer 504, and a via hole 505 for contact was formed by conventional photolithography method. An oxide layer 503a was formed by oxidizing the surface of the cobalt silicide layer 503, using plasma oxidation method for the cobalt silicide layer 503 in the bottom part of the via hole 505. (FIG. 16(a)).

Then, the silicon substrate 501 was placed in vacuum and heat treatment was applied to the silicon substrate 501 at 480° C. Next, by chemical vapor deposition method (CVD method) with hydrogen gas as carrier gas, a copper-manganese alloy layer 509 was formed on the sidewall 505a of the via hole 505 and on the cobalt silicide layer 503 exposed on the bottom surface of the via hole 505. (FIG. 16(b)). The flow rates of manganese and copper precursor materials were adjusted such that the concentration of manganese in the copper-manganese alloy layer 509 became 8 atom % Mn. Then, the inflow of manganese material was stopped and only the copper material was flown into with hydrogen carrier gas. Thereby, inside of the via hole 505 was filled with copper and a buried copper 510 was formed. (FIG. 17(c)).

Heat treatment was applied to the obtained sample in atmosphere containing oxygen at the oxygen partial pressure of $10^{-3}$ Pa at 480° C. for 2.5 hours. By this heat treatment, manganese contained in copper-manganese alloy layer 509 diffused in the direction toward the insulating layer 504 that constituted a sidewall 505a of the via hole 505. Thereby, a manganese oxide layer (sidewall side manganese oxide layer) 506 was formed on the interface of the insulating layer 504. Moreover, the manganese diffused in the interface of the oxide layer 503a, which was formed in the cobalt silicide layer, and an oxide layer (manganese oxide layer) was formed. More specifically, the manganese contacted to the oxide layer 503a of the cobalt silicide layer 503, and a first manganese oxide layer 506a that contained silicon was formed. Moreover, on the first manganese oxide layer 506a, a second manganese oxide layer 506b, which was composed of manganese with lower valence number than that of the first manganese layer 506, was formed.

Moreover, manganese in the copper-manganese alloy layer also diffused in a surface part of a buried copper 510, and an oxide (surface side manganese oxide layer) 506c that contained manganese was formed. Therefore, the copper-manganese alloy layer 509 was united with the buried copper 510 along with the layer made of copper, and it became a buried copper 507, which was composed of almost pure copper. By this way, when the copper-manganese alloy layer was used as a material, the double-layer-structured diffusion barrier composed of the first and second manganese oxide layers 506a and 506b, the buried copper 507, the sidewall manganese oxide layer 506, and the surface side manganese oxide layer 506c could be formed simultaneously by heating.

The surface side manganese oxide layer 506c formed on the surface of the buried copper 507 and extra copper formed on the surface of the insulating layer 504 were removed by chemical mechanical polishing (CMP), and the surface was washed. Thereby, a contact plug 500 was formed (FIG. 17(d)). By this way, contact resistance of the contact plug 500 constituted with the cobalt silicide layer 503, the first and second manganese oxide layers 506a and 506b and the buried copper (contact plug body) 507 was $1.89 \times 10^{-6}$ Ω/cm². It was possible to realize a contact plug that had low contact resistance.

In the above example 4, the copper-manganese alloy layer was formed and then the buried copper was formed so that it filled inside of the buried copper. However, heat treatment may be applied after filling the inside of the via hole completely with the copper-manganese alloy layer without forming the buried copper. By this method, the manufacturing process becomes simpler, and the contact plug can be manufactured more easily.

Example 5

A case of the present invention is explained with an example that a copper plug is formed by a convenient method that a diffusion barrier layer, composed of a first and second manganese oxide layers, and a buried copper are formed simultaneously, using a copper-manganese alloy layer.

The difference in the copper-manganese alloy layer mentioned in this example 5 from that in the example 3 is that while the copper-manganese alloy layer was formed by chemical vapor deposition in the example 4, in this example 5, the copper-manganese alloy layer was formed by sputtering method using a target material made of copper-manganese alloy.

First, a nickel coating was formed in a active region of transistor elements composed of semiconductor silicon for forming a silicide layer as described in the example 3. Then heat treatment was applied in vacuum at 480° C. for 2.5 hours, and nickel was turned to silicide, utilizing silicon in the active region of transistor elements. Thereby, a nickel silicide layer was formed. By this way, the nickel silicide layer, in which the amount of nickel chemically bonded to silicon decreased in the direction toward the surface of the nickel silicide layer, was formed.

Next, as described in the example 4, the surface of the nickel silicide layer, exposed in the bottom part of the via, was plasma-oxidized. The plasma oxidation was performed with 100 w output and 40 kHz of high frequency wave at 40 Pa of oxide gas pressure at ambient temperature for 10 minutes. By this process, the surface of the nickel silicide layer was oxidized, and 1 nm thickness of an amorphous oxide layer, mainly composed of silicon, was formed on the surface of the layer. Based on the strength of signals originated from chemical bonds of nickel and silicon, measured by x-ray photoelectron spectroscopy (XPS), the amount of nickel chemically bound to silicon in the area approximately 1 nm deep from the surface of the oxide layer was 1.5 times larger than that at the surface of the oxide layer.

Next, 5 nm thickness of a copper-manganese alloy layer was formed on the oxide layer by high frequency sputtering method. Copper-manganese alloy containing 4 atom % of manganese was used as a target material. The manganese atom concentration in the copper-manganese alloy layer formed was approximately 4%. Then, 100 nm thickness (approximately same depth as the via's) of a buried copper was formed on the copper-manganese alloy layer by high frequency sputtering method with highly pure copper as a target. Thereby, inside of the via was filled with copper, and the buried copper was formed.

Next, in atmosphere containing oxygen at $10^{-2}$ Pa of the oxygen partial pressure, heat treatment was applied to the sample at 480° C. for 2.5 hours. By this heat treatment, manganese in the copper-manganese alloy layer diffused to the oxide layer that constitutes the surface of the nickel silicide layer. Thereby, a diffusion barrier layer composed of a manganese oxide layer was formed on the oxide layer. More specifically, a manganese oxide layer, containing silicon whose diffusion origin was the nickel silicide layer or the oxide layer, was formed in the area near the interface of the oxide layer composed of oxide that contains silicon. By EDX (energy dispersive X-ray spectroscopy), the quantity ratio of elements that constituted the first manganese oxide layer was estimated as Mn:Si:O=2:2:7. Based on this, the oxidation number of manganese was considered to be trivalent.

The manganese oxide layer formed in the area adjacent to the interface of the oxide layer was composed of trivalent manganese. Moreover, since this manganese oxide layer contained silicon, it was judged that this manganese oxide layer was the first manganese oxide layer of the present invention. On this first manganese oxide layer, based on the results of the composition analysis by EDX, a manganese monoxide (composition formula: MnO) layer composed of divalent manganese was observed. Atom concentration of silicon in this manganese monoxide layer was lower than that in the first manganese oxide layer. In other words, a second manganese oxide layer of the present invention was formed.

When formed, 5 nm thickness of the copper-manganese alloy layer became a double-layered structure, which was constituted with the first and second manganese oxide layers as mentioned above. By the transmission electron microscope (TEM) observation on the cross section, thickness of the first manganese oxide layer was 2.6 nm. On the other hand, thickness of the second manganese oxide layer was smaller than that of the first manganese oxide layer and was 2.4 nm. Moreover, by electron diffraction analysis using TEM, the diffraction patterns from the first and second manganese oxide layers were halos. Therefore, the first and second manganese oxide layers were judged as amorphous layers. Moreover, from an image observation on the cross section with high resolution TEM (HRTEM), existence of crystallized regions was recognized in some parts of the second manganese oxide layer.

Moreover, the heat treatment mentioned above facilitated some manganese in the copper-manganese alloy layer to diffuse and move towards the surface of the buried copper. As a result, an upper part of the copper-manganese alloy layer united with the buried copper as well as a layer made of copper, and a copper contact plug layer composed of almost pure copper was formed. Moreover, manganese in the copper-manganese alloy layer moved in the direction toward the surface of the buried copper, and a manganese oxide layer was formed in the surface part of the buried copper. It was identified that the manganese oxide layer formed in the surface part of the buried copper had a composition of manganese dioxide (composition formula: $MnO_2$). Thickness of the manganese oxide layer formed on the surface of the buried copper was larger than those of the first and second manganese oxide layers formed on the side of the metal silicide layer side. It was 4.1 nm. Because the sample was heated in a condition that the surface of the buried copper was directly exposed to atmosphere containing oxygen, it was considered that probabilities that oxygen bound to manganese increased.

SIMS analysis was performed on the elements in the manganese oxide layer formed on the surface of the buried copper. The concentration of silicon atom in the manganese oxide layer was found to be lower than that in the second manganese oxide layer. Thus, it was further lower than that in the first manganese oxide layer such that it was about $2 \times 10^{17}$ cm$^{-3}$, which was close to the detection limit of the SIMS analysis. Moreover, using electron energy loss spectroscopy (EELS), the distribution of manganese atom concentration in the manganese oxide layer formed in the surface of the buried copper was investigated. The results showed that manganese atoms distributed such that the manganese atom concentration was maximum in the middle of the manganese oxide layer in the direction of layer thickness.

Since the heating temperature and heating time were set as same as those when the nickel coating was turned to silicide as mentioned above, the nickel constituting the nickel silicide layer was prevented from being liberated and entering the active region of transistor element composed of semiconductor silicon. Contact resistance of the copper contact plug measured by transmission line (TLM) method was $1.80 \times 10^{-6}$ $\Omega/cm^2$. A contact plug having low contact resistance was obtained.

In the above example 5, the copper manganese alloy layer was formed on the sidewall of the via hole and on the metal silicide layer, and the buried copper was formed such that it filled inside of the via hole. However, as the example 4 mentioned above, heat treatment may be applied to the sample without the buried copper after whole inside of the via hole is filled with the copper-manganese alloy layer. This method enables to reduce manufacturing processes and to manufacture the contact plug more easily.

Comparative Example 3

Figure 18:
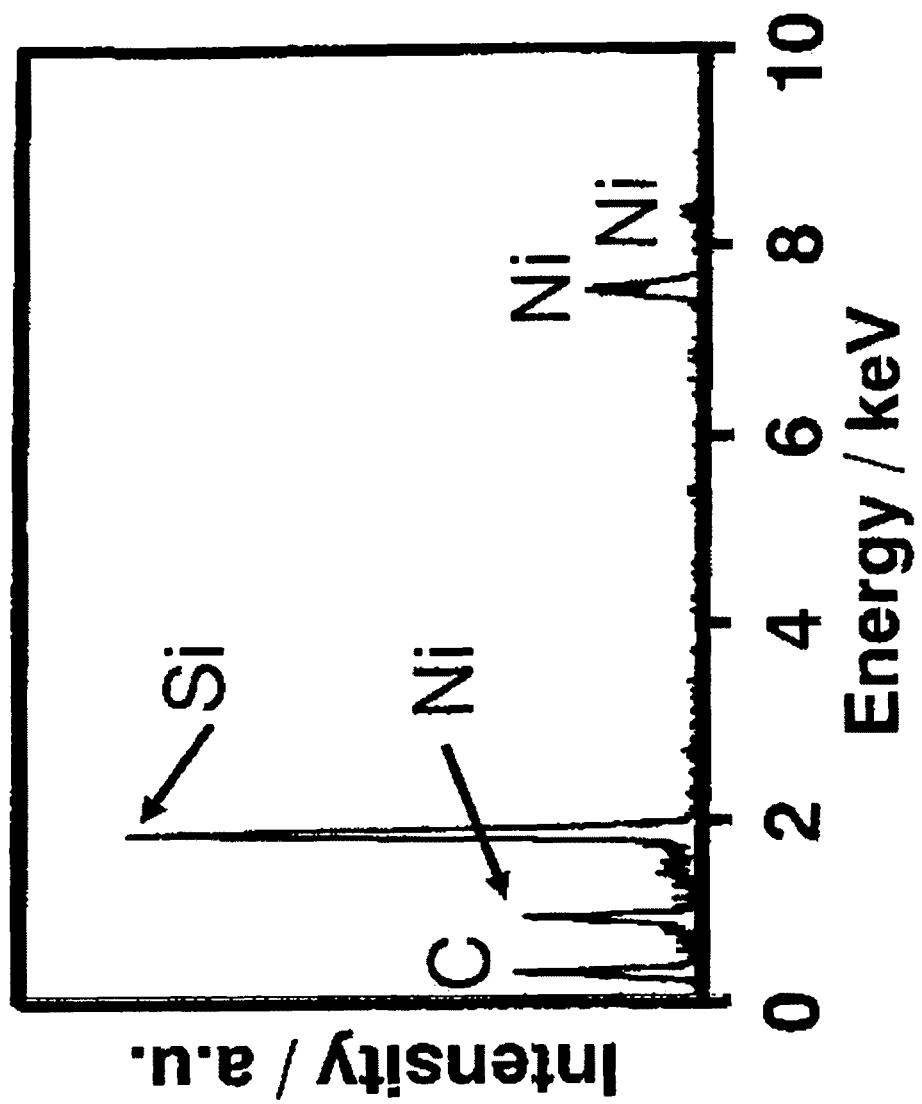
FIG. 18 is a figure that shows the results of element analysis for nickel silicide layer in a comparative example 3.

Only the difference from the above example 5 was temperature at which heat treatment was applied to the copper-manganese alloy layer. In this comparative example 3, heat treatment was applied at 580° C. for 2 hours. Unlike the example 5, the sample was heat-treated at higher temperature than the preferred temperature of the present invention. However, it was observed that the double-layer-structured manganese oxide layer could be formed by observing the cross section with TEM. Moreover, as shown in FIG. 18, copper was not detected in the nickel silicide layer by EDX method and it was observed that a diffusion barrier layer against copper was formed. However, when the copper contact plug was formed as described in the example 5, its contact resistance was high and it was $3.2 \times 10^{-6}$ $\Omega/cm^2$. One reason was considered that since the heat treatment was applied at temperatures higher than the preferable range (450° C.-550° C.), silicon diffused in the double-layered structure entirely and the valence number of manganese that constituted the manganese oxide layer became the same (for example trivalent) in the both layer. Thus, it was considered that adhesiveness of the manganese oxide layer to the copper contact plug was lost. Such large increase of the contact resistance occurred when temperature of the heat treatment was higher than 550° C.

Comparative Example 4

Only the difference from the above example 5 was the temperature of heat treatment applied to the copper-manganese alloy layer. In this comparative example 4, heat treatment was applied at below 450° C. The contact resistance of the copper contact plug increased as well even though the period of time for applying heat treatment was preferable for the present invention (1.5 hours-3 hours). One reason for the large increase of the contact resistance was considered that silicon didn't sufficiently permeate from the nickel silicide layer side to the manganese oxide layer side so that the nickel silicide layer and the manganese oxide layer were adhered. Therefore, after considering the result described in the above comparative example 3, the proper temperature range for forming the diffusion barrier layer composed of the double-layer-structured manganese oxide layer was more than 450° C. and less than 550° C.

Comparative Example 5

Only the difference from the above example 5 was temperature and period of time for which heat treatment was applied to the copper-manganese alloy layer. In the comparative example 5, heat treatment was applied at 500° C. for 4 hours. Different from the above example 5, by observing cross section with TEM, it was confirmed that a double-layer-structured manganese oxide layer was formed even after heat treatment was applied for a period of time longer than the preferable period of time of the present invention. In addition, even after heat treatment was applied for more than 3 hours, copper was not detected in the nickel silicide layer by EDX method. Thus, it was perceived that the ability of the diffusion barrier layer against copper was maintained. However, after the copper contact plug was formed as described in the above example 5, its contact resistance was high and was $2.9 \times 10^{-6}$ $\Omega/cm^2$. One reason was ascertained that since heat treatment was applied for the period of time longer than the appropriate range, the double-layered structure was wholly composed of manganese in large valence number (for example trivalent manganese). Even when heat treatment was within the preferable range of temperature, it was observed that the contact resistance increased largely if the heat was continuously applied for more than 3 hours.

Comparative Example 6

In this comparative example 6, period of time for which heat treatment was applied to the copper-manganese alloy layer was less than 1.5 hours. When the heat treatment was applied at more than 450° C. and less than 550° C. but for less than 1.5 hours, by TEM cross section inspection, it was ascertained that the manganese oxide layer with stable and clear double layer structure was not formed on the metal silicide layer. Particularly when the heat treatment was applied at 450° C., which was within the range of preferable temperature mentioned above but relatively low in the range, for less than 1.5 hours, a stable diffusion barrier layer, composed of double-layer structured manganese oxide layer, was not sufficiently formed. Moreover, under an insufficient condition, in which the heat treatment was applied at less than 450° C. for less than 1.5 hours, the manganese oxide layer formed was amorphous but was mostly a single layer. In addition, the contact resistance of the copper contact plug formed as the example 5 was extremely high and was more than $3.0 \times 10^{-6}$ $\Omega/cm^2$. One reason was considered that because of the insufficient heat treatment, the diffusion of silicon from the metal silicide layer side did not properly proceed and the adhesion between the metal silicide layer and the oxide layer did not increase.

If the double layer structure constituted with the first and second manganese oxide layers of the second embodiment of the present invention is used as a diffusion barrier layer, it is possible to prevent copper constituting a contact plug from diffusing and penetrating into an active region of transistor elements. Thus, it is possible to use the present invention for producing semiconductor elements such as CMOS transistor that normally operates for long periods of time.

Moreover, if the diffusion barrier layer of double layer structure constituted with the first and second manganese oxide layers of the second embodiment of the present invention is used, it is possible to form a copper contact plug, whose electric contact resistance is low. Therefore, it is possible to use the present invention to manufacture a display device such as flat panel display (FPD) with high operational reliability and low power consumption.

Moreover, the interconnection containing the copper contact plug provided through the diffusion barrier layer of double layer structure of the second embodiment of the present invention, particularly the copper interconnection that is composed of the copper interconnection body, whose specific resistance is low, can realize an interconnection that has low electric resistance. Therefore, such interconnection can be utilized for manufacturing silicon integrated circuits, whose RC delays are low, or solar cells that are superior in incident photon-to-current conversion efficiency.

Third Embodiment

Figure 19:
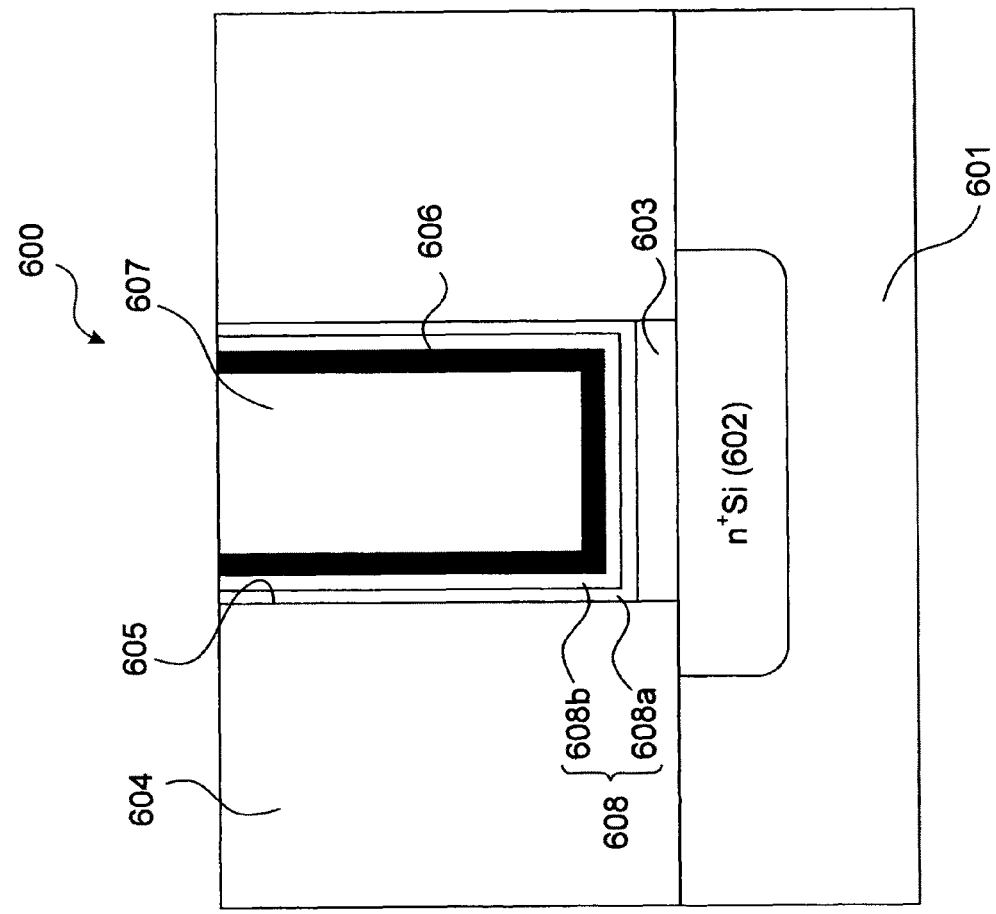
FIG. 19 is a figure that shows a contact plug structure of the third embodiment.

FIG. 19 shows a contact plug of a third embodiment of the present invention. In FIG. 19, a contact plug 600 is formed at a contact hole 605 provided in an insulating layer 604 of a semiconductor device. A metal silicide layer 603 is formed at a bottom part of the contact hole 605. The metal silicide layer 603 is formed on a part where concentration of phosphorus is excessive ($n^+$Si layer) in a surface layer region of a silicon substrate 601. A barrier layer 608 is formed on the metal silicide film 603 in the contact hole 605. The barrier layer 608 is formed on a sidewall of the contact hole 605 as well as the metal silicide layer 603. A manganese oxide layer 606 is formed on the barrier layer 606. Here, the manganese oxide layer 606 is amorphous and includes silicon. The manganese oxide layer 606 is formed on a sidewall of the barrier layer 608 as well as the bottom surface. Further, a buried copper 607 is formed on the manganese oxide layer 606 so as to fill the contact hole 605.

This embodiment shows an example where the barrier layer is formed of a double layer of a first barrier layer 608a and a second barrier layer 608b. However, the barrier layer may be formed of only one layer. For example, the barrier layer may be formed of titanium nitride (TiN) or tantalum nitride (TaN).

Examples of the first barrier layer 608a and the second barrier layer 608b are Ti and TiN or Ta and TaN, respectively. The order of the layers is changeable.

Further, an oxide layer may be formed on the surface part of the metal silicide layer 603. In other words, the oxide layer may be formed between the metal silicide layer 603 and the barrier layer 608.

A method for forming the contact plug of this embodiment is basically the same as that of the first embodiment except for a necessity of adding a step for forming the barrier layer 608. More specifically, the method for forming the contact plug of this embodiment will be explained with the steps for forming the contact plug of the first embodiment shown in FIG. 8.

In FIG. 8(a), the nickel silicide layer (metal silicide layer) 203 (corresponding to the metal silicide layer 603 of this embodiment) and the oxide layer 208 are formed. After that, the barrier layer 608 is formed.

In a case where the barrier layer is composed of one layer, for example, a single TiN layer may be formed by a reactive sputtering method using mixture gas of argon and nitrogen as sputtering gas while Ti is sputtered. Further, a single TiN layer may be formed by applying a heat treatment in nitrogen atmosphere after a Ti layer is formed by a sputtering method. Further, a single TiN layer may be formed by applying a heat treatment after a Ti layer and a TiN layer are successively formed by a sputtering method. Further, a single TiN layer may also be formed by successively forming a Ti layer and a TiN layer by a chemical vapor deposition (CVD) method because nitrogen in the TiN layer diffuses into the Ti layer due to heat when TiN layer is formed by a CVD method. These apply to a case where TaN is formed.

On the other hand, in a case where the barrier layer is composed of double layers, the double layers of Ti/TiN may be obtained by forming a thicker Ti layer than the one for forming a single barrier layer. This is because, a part of the Ti layer remains Ti without changing into TiN as nitrogen cannot diffuse into the entire Ti layer. These apply to a case where double layers of Ta/TaN are formed.

After forming the barrier layer 608 in this way, the copper-manganese alloy layer 209, etc., is formed as shown in FIG. 8(b).

According to the forming steps mentioned above, the contact plug of this embodiment may be formed.

Example 6

One example of this embodiment will hereinafter be explained, where the copper contact plug is formed using a barrier layer composed of TiN/Ti or TaN/Ta structure.

Metal silicide of 303 was formed in the same method as described in the previous examples. Directly on top the silicide layer, the barrier layers of 308a and 308b were formed sequentially. The materials of choice for the barrier layers 308a and 308b were Ti and TiN or Ta and TaN.

The TiN layer was formed by low pressure chemical vapor deposition (LPCVD) using a precursor gas of TiCl$_4$ and a reaction and carrier gases of NH3 and N2. The flow rate was 40 sccm for TiCl$_4$, 100 sccm for NH$_3$ and 3000 sccm for N$_2$. Substrate temperature was set at 500° C. Deposition pressure was 20 Torr. Subsequently, the Ti layer was formed by plasma enhanced chemical vapor deposition (PECVD) using the precursor gas of TiCl$_4$ and the carrier gases of H$_2$ and Ar. The flow rate was 3.5 sccm for TiCl4, 1500 sccm for H$_2$ and 300 sccm for Ar. Substrate temperature was 500° C. Deposition pressure was 5 Torr. Plasma power was 250 W.

The TaN and Ta layers were formed by a sputtering method. In the case of the TaN barrier, the Ta target metal was sputtered at a RF power of 200 W at a Ar gas flow rate of 50 sccm. In the case of the TaN barrier, the Ta target metal was sputtered under the same condition, except that the N$_2$ gas was mixed with the Ar gas at a flow rate ratio of Ar/N$_2$=80/20. Substrate temperature was maintained below 50° C. during deposition.

After depositing the Ti/TiN barrier layers, or the Ta/TaN barrier layers to the nominal thickness of 2 nm/2 nm, a Mn oxide layer was deposited by CVD, followed by filling the gap with Cu to complete the contact plug formation process. This sample was subject to heat treatment at 400° C. for 100 h and the possibility of interdiffusion between Cu and Si was examined using transmission electron microscopy and x-ray energy dispersive spectroscopy. No interdiffusion was observed when the Mn oxide layer was deposited. On the contrary, occasional interdiffusion was observed when the Mn oxide layer was not deposited. Wherever the interdiffusion was observed, the total thickness of the Ti/TiN or the Ta/TaN barrier layer was thinner than 1 nm so that the layer did not have a diffusion barrier function. These results indicate that the role of the Mn oxide layer was to cover the thin spots of the barrier layer. This effect was more pronounced in the Ta/TaN barrier layer because of the poor coverage by sputter deposition.

The same results could be obtained by depositing Cu—Mn alloy directly on the Ti/TiN or the Ta/TaN barrier layer having the nominal thickness of 2 nm/2 nm. In this case, after the deposition of the Cu—Mn layer followed by gap filling with pure Cu, heat treatment was performed in the temperature range of 150 to 550° C. for 10 to 30 minutes. Then, further heat treatment was performed at 400° C. for 100 h to examine possible interdiffusion between Cu and Si. When the Cu—Mn layer was deposited, no interdiffusion was observed. On the contrary, without the Cu—Mn layer, interdiffusion was observed in the places where the thickness of the Ti/TiN or the Ta/TaN barrier layer was thinner than 1 nm. X-ray energy dispersive spectroscopy of the Cu—Mn sample indicated the enrichment of Mn at the thin spots of the barrier layer. Similarly to the Mn oxide case, Mn atoms diffused to the thin spots to form the Mn oxide and acted as a robust diffusion barrier layer.

The preferred embodiment of the present invention has been described in reference to the accompanying drawings; however, the present invention is not limited to such an example. It should be appreciated that one skilled in the art can think up various variations and modifications within ideas described in the claims, and such variations and modifications fall within a technical scope of the present invention. Furthermore, some features of the present invention and their effects will be summarized as follows.

(1) the first feature of this invention is a contact plug that is formed in a contact hole provided in an insulating film of a semiconductor device, including: a metal silicide film formed at a bottom part of the contact hole; a manganese oxide film formed on the metal silicide film in the contact hole; and a copper plug layer formed on the manganese oxide film to fill the contact hole.

(2) The second feature of this invention is the feature described in the section (1), wherein a surface layer of the metal silicide film is oxidized.

(3) The third feature of this invention is the feature described in the section (1) or (2), wherein the manganese oxide film is formed on the metal silicide film in the contact hole and formed on a sidewall of the contact hole.

(4) The fourth feature of this invention is the feature described in any one of the sections (1) to (3), wherein the manganese oxide film is an amorphous film.

(5) The fifth feature of this invention is the feature described in the section (4), wherein the manganese oxide film is a film that contains silicon (element symbol: Si).

(6) The sixth feature of this invention is the feature described in the section (5), wherein bond energy of manganese (Mn) in the manganese oxide film increases from a film surface of the manganese oxide film towards a deep portion in a film thickness direction.

(7) The seventh feature of this invention is the feature described in any one of the sections (1) to (6), wherein a film thickness of the manganese oxide film is not less than 0.5 nanometer (nm) and not more than 7 nm.

(8) The eighth feature of this invention is the feature described in any one of the sections (1) to (7), wherein the metal silicide film includes any one of cobalt (element symbol: Co), titanium (element symbol: Ti), nickel (element symbol: Ni), and tungsten (element symbol: W).

(9) The ninth feature of this invention is the feature described in the section (8), wherein the metal silicide film is a nickel (Ni) silicide film.

(10) The tenth feature of this invention is the feature described in the section (8), wherein the metal silicide film is a cobalt (Co) silicide film.

(11) The eleventh feature of this invention is an interconnection, including the contact plug described in any one of the sections (1) to (10); and an interconnection body that is electrically connected to the contact plug.

(12) The twelfth feature of this invention is the feature described in the section (11), wherein the interconnection body includes copper (Cu).

(13) The thirteenth feature of this invention is a semiconductor device, including the contact plug described in any one of the sections (1) to (10).

(14) The fourteenth feature of this invention is a semiconductor device, including the interconnection described in the section (11).

(15) The fifteenth feature of this invention is a semiconductor device, including the interconnection described in the section (12).

(16) The sixteenth feature of this invention is a method for forming a contact plug that forms the contact plug in a contact hole provided at an insulating film of a semiconductor device, the method including the steps of:
a metal silicide film exposing step for exposing a surface of the metal silicide film located at the bottom surface of the contact hole;
a manganese oxide film forming step for forming the manganese oxide film on the metal silicide film exposed at the bottom surface of the contact hole and at a sidewall of the contact hole; and
a copper plug layer forming step for depositing copper on the manganese oxide film to fill the contact hole, thereby forming the copper plug layer, which leads to a contact plug body.

(17) The seventeenth feature of this invention is a method for forming a contact plug that forms the contact plug in a contact hole provided at an insulating film of a semiconductor device, the method including the steps of:
a metal silicide film exposing step for exposing a surface of the metal silicide film located at the bottom surface of the contact hole;
a copper-manganese alloy layer forming step for forming a copper-manganese alloy layer by depositing a copper-manganese (Cu—Mn) alloy on the metal silicide film exposed at the bottom surface of the contact hole and at a sidewall of the contact hole;
a copper layer forming step for forming a copper layer by depositing copper to be filled inside the contact hole on which the copper-manganese alloy layer is formed; and
a heat treatment step for performing a predetermined heat treatment to the copper-manganese alloy layer,
wherein manganese in the copper-manganese alloy layer is diffused by the heat treatment, which changes the copper-manganese alloy layer to be formed only of copper and unifies the copper-manganese alloy layer with the copper layer, thereby forming a copper plug layer, which leads to a contact plug body, and
wherein a manganese oxide film is formed at an interface of the copper plug layer and the metal silicide film and between the copper plug layer and the sidewall of the contact plug.

(18) The eighteenth feature of this invention is a method for forming a contact plug that forms the contact plug in a contact hole provided at an insulating film of a semiconductor device, the method including the steps of:
a metal silicide film exposing step for exposing a surface of the metal silicide film located at the bottom surface of the contact hole;
a copper-manganese alloy layer forming step for forming a copper-manganese alloy layer by depositing a copper-manganese (Cu—Mn) alloy on the metal silicide film exposed at the bottom surface of the contact hole and at a sidewall of the contact hole; and
a heat treatment step for performing a predetermined heat treatment to the copper-manganese alloy layer, wherein manganese in the copper-manganese alloy layer is diffused by the heat treatment, which changes the copper-manganese alloy layer to be formed only of copper, thereby forming a copper plug layer, which leads to a contact plug body, and wherein a manganese oxide film is formed at an interface of the copper plug layer and the metal silicide film and between the copper plug layer and the sidewall of the contact plug.

(19) The nineteenth feature of this invention is the feature described in any one of the sections (16) to (18), wherein the surface of the metal silicide film exposed in the metal silicide film exposing step is oxidized, and an oxide film is formed from an element that constitutes the metal silicide film.

(20) The twentieth feature of this invention is the feature described in the section (19), wherein the oxidization of the surface of the metal silicide film is performed by exposing the surface of the metal silicide film to an oxygen plasma.

(21) the twenty first feature of this invention is a contact plug formed in a contact hole provided in an insulating film of a semiconductor device, including:

a metal silicide film formed at a bottom part of the contact hole, a first manganese oxide film formed on the metal silicide film in the contact hole, the first manganese oxide film being amorphous and including silicon, a second manganese oxide film formed on the first manganese oxide film, the second manganese oxide film including microcrystals and being amorphous, and a copper plug layer formed on the second manganese oxide film such that the contact hole is filled.

(22) The twenty second feature of this invention is the feature described in the section (21), wherein the first manganese oxide film and the second manganese oxide film are composed of manganese (Mn) with different oxidation numbers.

(23) The twenty third feature of this invention is the feature described in the section (21) or (22), wherein the oxidation number of manganese in the first manganese oxide film is a trivalent.

(24) The twenty fourth feature of this invention is the feature described in any one of the sections (21) to (23), wherein the oxidation number of manganese in the second manganese oxide film is a divalent.

(25) The twenty fifth feature of this invention is the feature described in any one of the sections (21) to (24), wherein a concentration of silicon (Si) atoms inside the first manganese oxide film is higher than the ones inside the second manganese oxide film.

(26) The twenty sixth feature of this invention is the feature described in any one of the sections (21) to (25), wherein thickness of the first manganese oxide film is not less than thickness of the second manganese oxide film.

(27) The twenty seventh feature of this invention is the feature described in any one of the sections (21) to (26) wherein, wherein total thickness of the first manganese oxide film and the second manganese oxide film is not more than 7 nanometer (nm).

(28) The twenty eighth feature of this invention is the feature described in any one of the sections (21) to (27), wherein the metal silicide film is formed of any of cobalt (Co), titanium (Ti), and nickel (Ni) and tungsten (W).

(29) The twenty ninth feature of this invention is the feature described in the section (28), wherein the metal silicide film is a nickel (Ni) silicide film.

(30) The thirtieth feature of this invention is the feature described in the section (28), wherein the metal silicide film is a cobalt (Co) silicide film.

(31) The thirty first feature of this invention is the feature described in any one of the sections (21) to (30), wherein the metal silicide film has an oxidized surface layer part.

(32) The thirty second feature of this invention is the feature described in any one of the sections (21) to (31), wherein the metal silicide film has atomic concentration of a metal that is chemically bound to silicon (Si), the atomic concentration decreasing toward a direction of increase in film thickness.

(33) The thirty third feature of this invention is the feature described in any one of the sections (21) to (32), further including an amorphous manganese oxide film formed at a sidewall of the contact hole.

(34) The thirty fourth feature of this invention is an interconnection including:

the contact plug as recited in any one of the sections (21) to (33); and an interconnection body that is electrically connected to the contact plug.

(35) The thirty fifth feature of this invention is the feature described in the section (34), wherein the interconnection body is composed of copper (Cu).

(36) The thirty sixth feature of this invention is a semiconductor device including:

the contact plug as recited in any one of the sections (21) to (33).

(37) The thirty seventh feature of this invention is a semiconductor device including:

the interconnection as recited in the section (34) or (35).

(38) The thirty eighth feature of this invention is a method for forming a contact plug where the contact plug is formed in a contact hole provided in the insulating film of a semiconductor device, the method including the steps of:

a metal silicide film forming step for forming a metal silicide film at a bottom surface of the contact hole, a first manganese oxide film forming step for forming a first manganese oxide film on the metal silicide film and at a sidewall of the contact hole, the first manganese oxide film being amorphous and including silicon, a second manganese oxide film forming step for forming a second manganese oxide film on the first manganese oxide film, the second manganese oxide film including microcrystals and being amorphous, and a copper plug layer forming step for forming a copper plug layer on the second manganese oxide layer by depositing copper such that the copper fills the contact hole, thereby forming the contact plug body.

(39) The thirty ninth feature of this invention is a method for forming a contact plug where the contact plug is formed in a contact hole provided in the insulating film of a semiconductor device, the method including the steps of:

a metal silicide film forming step for forming a metal silicide film at a bottom surface of the contact hole;

a copper-manganese alloy layer forming step for forming a copper-manganese alloy layer on the metal silicide film and at a sidewall of the contact hole by depositing copper-manganese (Cu—Mn);

a copper layer forming step for forming a copper layer by depositing copper such that the copper is filled inside the contact hole in which the copper manganese alloy layer is formed; and a heat treatment step for applying a predetermined heat treatment to the copper manganese alloy layer and the copper layer, wherein manganese in the copper-manganese alloy layer is diffused by the heat treatment, which changes the copper-manganese alloy layer to be formed only of copper and unifies the copper-manganese alloy layer with the copper layer, thereby forming a copper plug layer, which leads to a contact plug body, and wherein a first manganese oxide film is formed between the copper plug layer and the metal silicide film at the metal silicide film side by the heat treatment step, the first manganese oxide film being amorphous and including silicon, and a second manganese oxide film is formed on the first manganese oxide film, the second manganese oxide film including microcrystals and being amorphous, thereby forming a manganese oxide film between the copper plug layer and the sidewall of the contact hole.

(40) The fortieth feature of this invention is a method for forming a contact plug where the contact plug is formed in a contact hole provided in the insulating film of a semiconductor device, the method including the steps of:

a metal silicide film forming step for forming a metal silicide film at a bottom surface of the contact hole;

a copper-manganese alloy layer forming step for forming a copper-manganese alloy layer on the metal silicide film and at a sidewall of the contact hole by depositing copper-manganese (Cu—Mn);

a heat treatment step for applying a predetermined heat treatment to the copper manganese alloy layer and the copper layer, wherein manganese in the copper-manganese alloy layer is diffused by the heat treatment, which changes the copper-manganese alloy layer to be formed only of copper, thereby forming a copper plug layer, which leads to a contact plug body, and wherein a first manganese oxide film is formed between the copper plug layer and the metal silicide film at the metal silicide film side by the heat treatment step, the first manganese oxide film being amorphous and including silicon, and a second manganese oxide film is formed on the first manganese oxide film, the second manganese oxide film including microcrystals and being amorphous, thereby forming a manganese oxide film between the copper plug layer and the sidewall of the contact hole.

(41) The forty first feature of this invention is the feature described in the section (38) to (40), wherein the oxide layer of silicon is formed by oxidizing a surface of the metal silicide film.

(42) The forty second feature of this invention is the feature described in the section (41), wherein the oxidization of the surface of metal silicide film is performed by exposing the surface of the metal silicide film to oxygen plasma.

According to the first feature of this invention, it is configured that the contact plug formed of copper (Cu) is provided on the manganese oxide film formed on the surface of the metal silicide film in the contact hole which is provided in the insulating film and of which the metal silicide film is located at the bottom part. In other words, it is configured that the contact plug is formed on the manganese oxide film, which can sufficiently exert an effect of suppressing copper atom diffusion even if it is thin. Therefore, it is possible to provide a contact plug made of copper (Cu) that does not adversely affect, for example, the source or drain characteristics of transistors. Moreover, even if the diffusion barrier layer of the double layer structure according to the conventional technology is not used, it is possible to provide a copper (Cu) contact plug with low contact resistance.

According to the second feature of this invention, it is configured that the manganese oxide film is formed on the metal silicide film where the oxide file is formed at the surface part by oxidization. Therefore, it is possible to achieve the diffusion barrier layer including the manganese oxide film that has superior adhesiveness to the metal silicide film.

According to the fourth feature of this invention, it is configured that the manganese oxide film on the metal silicide film is formed especially of an amorphous material that is without crystal grain boundary. Accordingly, it is possible to avoid current for operating a transistor element (element operation current) needlessly leaking like a short circuit through a crystal grain boundary into an functional region of the transistor element such as a gate region. Therefore, it is possible to stably provide for constituting integrated circuits that manifest a normal gate action that excels in pitch-off characteristics, etc.

According to the fifth feature of this invention, it is configured that the management oxide film formed on the metal silicide film is formed especially from a manganese oxide film that includes silicon (Si). Accordingly, as a result of including silicon; it is possible to achieve the manganese oxide film with advanced adhesiveness with the metal silicide film. Therefore, it is possible to form the manganese oxide planarly adhered to the entire surface of the metal silicide, thus, it is possible to expand the range of a flowing path of transistor element operating current to the metal silicide film through the contact plug on the manganese oxide film. As a result, it is possible to eventually contribute to providing a contact plug of low contact resistance.

According to the sixth feature of this invention, in the manganese oxide film on the metal silicide film, the deeper from the surface in the film thickness direction it is, the more energy such as a 2 p orbit of a manganese (Mn) atom increases. In other words, bond energy of manganese (Mn) atoms is greater from the surface toward a deep portion of the metal silicide film side. Accordingly, the manganese oxide film can exert a function as a diffusion barrier layer for suppressing diffusion of copper (Cu) that constitutes the contact plug located over the manganese oxide film into the metal silicide film, furthermore, into an functional region of a transistor element made of silicon, etc. Therefore, it is possible to provide a transistor element that constitutes an integrated circuit that shows a normal source/drain characteristics or gate characteristics.

According to the seventh feature of this invention, the manganese oxide film formed on the metal silicide film is formed by the film thickness of not less than 0.5 nm and not more than 7 nm. Accordingly, it becomes the film thickness where a current flows linearly for an electric voltage applied to the contact plug. Therefore, it is possible to stably form a contact plug made of copper (Cu) that has superior Ohmic contact.

According to the eighth feature of this invention, it is configured that the manganese oxide film is formed on the silicide film of any metal among cobalt (Co), titanium (Ti), nickel (Ni) and tungsten (W). Therefore, it is possible to provide a copper (Cu) contact plug that shows superior Ohmic contact.

According to the ninth feature of this invention, the metal silicide film where the manganese oxide film is provided is the nickel (Ni) silicide film. Therefore, it is possible to achieve a contact plug with low contact resistance and good Ohmic characteristics.

According to the tenth feature of this invention, the metal silicide film where the manganese oxide film is provided is the cobalt (Co) silicide film. Therefore, it is possible to achieve a contact plug with low contact resistance and good Ohmic characteristics.

According to the eleventh feature of this invention, the interconnection is constituted using the contact plug according to the feature defined in any one of the first to the tenth mentioned above, which is made of copper (Cu). Therefore, it is possible to achieve an effect of forming an interconnection with low electrical resistance for transistor element operation current.

According to the twelfth feature of this invention, the interconnection body is used especially for the interconnection that is formed of copper. Therefore, it is possible to form an interconnection with low electrical resistance. As a result, by using such copper interconnection, it is possible to form an integrated circuit with low power consumption and low RC delay.

According to the thirteenth feature of this invention, a semiconductor device with a contact plug composed of copper (Cu) according to the feature defined in any one of the first to the tenth mentioned above is provided. By using the contact plug composed of copper (Cu) defined in any one of the first to the tenth mentioned above, it is possible to form transistor elements with low power consumption and low RC delay, and an integrated circuit where these transistor elements are integrated.

According to the fourteenth feature of this invention, a semiconductor device with the interconnection according to the eleventh feature mentioned above is provided. By using the interconnection with the contact plug formed of copper that has low contact resistance, it is advantageous to configure a semiconductor device such as transistor elements with low power consumption and low RC delay, and an integrated circuit where the transistor elements are integrated.

According to the fifteenth feature of this invention, a semiconductor device with an interconnection formed of copper according to the twelfth feature mentioned above is provided. Here, the interconnection body with copper (Cu) that has low specific resistance even if compared to conventional aluminum (Al) is used in addition to the contact plug composed of copper with low contact resistance. Therefore, it is possible to advantageously configure a semiconductor device such as transistor elements with low power consumption and low RC delay, and an integrated circuit where the transistor elements are integrated.

According to the sixteenth feature of this invention, it is configured that the contact plug formed of copper (Cu) is provided on the manganese oxide film formed on the surface of the metal silicide film in the contact hole which is provided in the insulating film and of which the metal silicide film is located at the bottom part. Since the contact plug is formed on the manganese oxide film, which can sufficiently exert an effect of suppressing copper atom diffusion even if it is thin. Therefore, it is possible to provide a contact plug made of copper (Cu) that does not adversely affect, for example, the source or drain characteristics of transistors. Moreover, even if the diffusion barrier layer of the double layer structure according to the conventional technology is not used, it is possible to provide a copper (Cu) contact plug with low contact resistance.

According to the seventeenth and eighteenth features of this invention, heat is applied after the copper (Cu)/manganese (Mn) alloy film has been deposited on the metal silicide film. Therefore, it is possible to simultaneously form the manganese oxide film at the area in the vicinity of an interface of the alloy film and the metal silicide film, and the copper (Cu) that constitutes the contact plug at the upper portion of the alloy film.

According to the nineteenth feature of this invention, after the surface of the metal silicide film has been oxidized, the oxide film composed of the element that constitutes the metal silicide film is formed at the surface part of the metal silicide film, and then the manganese oxide film is formed on the oxide film. Therefore, it is possible to form the contact plug that can sufficiently function as a diffusion barrier for copper (Cu) atom diffusion.

According to the twentieth feature of this invention, the manganese oxide film is formed after the surface of the metal silicide film has been oxidized by exposing to oxygen plasma. Therefore, it is possible to form a diffusion barrier layer that can sufficiently exert a barrier function for diffusion of copper (Cu) atom.

According to the twenty first feature of this invention, the diffusion barrier layer which is composed of the first manganese oxide film and the second manganese oxide film. The first manganese oxide film is amorphous and includes silicon. The second manganese oxide film includes microcrystals and is amorphous.

Because the first manganese oxide film is amorphous and does not have a crystal grain boundary, it has a function to prevent accelerated abnormal diffusion of copper into the metal silicide film through the crystal grain boundary, thus it can surely prevent diffusion and invasion of copper atoms into the metal silicide film. Moreover, because the second manganese oxide film includes microcrystals, it has a region with low electric resistance inside, thus it has a function to increase conductivity. Therefore, the first and the second manganese oxide film adequately exercise a function as diffusion barrier layers against copper by the synergetic effect of every function, and can contribute to securely forming a copper contact plug with low electric contact resistance for the metal silicide film.

According to the twenty second feature of this invention, the first manganese oxide film and the second manganese oxide film are formed of manganese (Mn) with different oxidation numbers, and thus differs in chemical characteristics. Therefore, it is possible to form the first manganese oxide film from a manganese oxide film composed of manganese with a chemical configuration that results in superior adhesiveness with the metal silicide film. Moreover, it is possible to advantageously form the second manganese oxide film from a manganese oxide film composed of manganese with a chemical configuration that results in better conductivity.

According to the twenty third feature of this invention, the oxidation number of manganese in the first manganese oxide film is trivalent. Therefore, it is possible to obtain a diffusion barrier layer formed of the first manganese oxide film that has superior adhesiveness with the metal silicide film that includes any of cobalt, titanium, nickel, or tungsten, especially a nickel silicide film or a cobalt silicide film.

According to the twenty fourth feature of this invention, the oxidation number of the second manganese oxide film is divalent. Therefore, it is possible to form the second manganese oxide film with secure adhesiveness with the copper contact plug. Moreover, it is possible to obtain a copper contact plug with low electric contact resistance for the metal silicide film.

According to the twenty fifth feature of this invention, the concentration of silicon atoms inside the first manganese oxide film is higher than the concentration of silicon atoms of the second manganese oxide film. For example, the first manganese oxide film is se to the composition formula $Mn_a Si_B O_Y$ ($a \neq 0$, $B \neq 0$, $Y \neq 0$), which includes silicon, and the second manganese oxide film is set to manganese monoxide (composition formula: MnO). Therefore, it is possible to obtain a diffusion barrier layer with the first manganese oxide film adhered to the metal silicide film more securely.

According to the twenty sixth feature of this invention, the thickness of the first manganese oxide film is not less than the thickness of the second manganese oxide film. In other words, the first manganese oxide film formed on the metal silicide film is relatively thicker than the second manganese oxide film, therefore it is possible to increase the effect in prevention of diffusion and invasion of copper that constitutes the contact plug into the metal silicide film.

According to the twenty seventh feature of this invention, the total thickness of the first and the second manganese oxide films is not more than 7 nm. Therefore, it is possible to contribute to stably providing a copper contact plug that can achieve Ohmic contact with the metal silicide film. For example, it is possible to stably obtain a copper contact plug with low electric contact resistance such as $2 \times 10^{-5}$ $\Omega \cdot cm^2$ or less on the nickel silicide film.

According to the twenty eighth feature of this invention, the metal silicide film at which the first manganese oxide film is provided is set to a metal silicide film that includes any of cobalt, titanium, nickel, and tungsten. Therefore, it is possible to efficiently achieve a diffusion barrier layer composed of a double layer structure of a manganese oxide film that has superior adhesiveness with the metal silicide film and exercises good diffusion barrier characteristics for copper.

According to the twenty ninth feature of this invention, the metal silicide film where the first manganese oxide film is provided is especially a nickel silicide film. Therefore, there is an effect to configure a diffusion barrier layer composed of a double layer structure of a manganese oxide film that has superior adhesiveness with the metal silicide film and exceedingly exercises better diffusion barrier characteristics for copper.

According to the thirtieth feature of this invention, the metal silicide film where the first manganese oxide film is provided is a cobalt silicide film. Therefore, the same as when the metal silicide film is a nickel silicide film, it is possible to configure a diffusion barrier layer composed of a double layer structure of a manganese oxide film that has superior adhesiveness with the metal silicide film and exceedingly exercises better diffusion barrier characteristics for copper.

According to the thirty first feature of this invention, it is configured such that the first manganese oxide film is formed on the metal silicide film having the oxidized surface layer part. Therefore, it is possible to make the adhesiveness of the first manganese oxide film with the metal silicide film even stronger.

According to the thirty second feature of this invention, it is configured that the metal silicide film has atomic concentration of the metal that is chemically bound to silicon (Si), the atomic concentration decreasing toward the direction of increase in film thickness, and the manganese oxide film with the double layer structure is formed on the metal silicide film as an underlying layer. Therefore, it is possible to provide a metal silicide film that adheres strongly to the transistor element functional region formed of semiconductor silicon and can achieve secure junction with the diffusion barrier layer formed of manganese oxide.

According to the thirty third feature of this invention, the amorphous manganese oxide film is formed at the sidewall of the contact hole. Therefore, because there is no grain boundary, which is a high speed diffusion path in a crystal film, it is possible to obtain a superior diffusion barrier layer.

According to the thirty fourth feature of this invention, the interconnection is formed using the contact plug of this invention, Therefore, it is possible to build an interconnection with low electric resistance, for example, an interconnection with a multi layer structure of damascene type with low electric resistance.

According to the thirty fifth feature of this invention, in the interconnection that connects electrically to the contact plug, the interconnection body is composed of copper, which has lower electric resistance than aluminum, etc. Therefore, it is possible to provide an interconnection that has low electric resistance and is effective, for example, in reducing the RC delay.

According to the thirty sixth feature of this invention, the semiconductor device includes the contact plug of this invention. Therefore, by using a copper contact plug with low electric contact resistance with the metal silicide film, it is possible to provide, for example, a semiconductor display device such as a large scale TFT-LCD with low RC delay and low power consumption.

According to the thirty seventh feature of this invention, the semiconductor device is configured using the interconnection having the copper contact plug that has low electric contact resistance with metal silicide film. Therefore, it is possible to provide a semiconductor memory device with low RC delay and low power consumption such as a silicon semiconductor memory, etc. Moreover, the semiconductor device is configured using the interconnection having the copper contact plug with low electric contact resistance with the metal silicide film and having copper with low electric resistance as the interconnection body. Therefore, it is possible to provide a semiconductor logic device with low RC delay and low power consumption, such as silicon large scale integrated circuits, etc.

According to the thirty eighth, thirty ninth, and fortieth features of this invention, the method for forming the contact plug where the contact plug is formed in the contact hole provided in the insulating film of the semiconductor device, the method including the steps of: forming the first manganese oxide film on the metal silicide film, the first manganese oxide film being amorphous and including silicon, forming the second manganese oxide film on the first manganese oxide film, the second manganese oxide film including microcrystals and being amorphous, thereby forming the diffusion barrier layer composed of the first and the second manganese oxide films. Because the first manganese oxide film is amorphous and does not have a crystal grain boundary, it has a function to prevent accelerated abnormal diffusion of copper into the metal silicide film through the crystal grain boundary, thereby securely preventing diffusion and invasion of copper atoms into the metal silicide film. Moreover, because the second manganese oxide film includes microcrystals, it has a region with low electric resistance internally, and thus has a function to improve conductivity. Therefore, the first and the second manganese oxide films can contribute to stably forming a copper contact plug with low electric contact resistance for the metal silicide film due to the synergetic effect of individual functions, while sufficiently exercising the function as the diffusion barrier layer for copper.

According to the forty first and the forty second feature of this invention, the oxide layer of silicon is formed by oxidizing the surface of the metal silicide film. Therefore, it is possible to make the adhesiveness between the first manganese oxide film and the metal silicide film stronger.

What is claimed is:

1. A contact plug structure formed on a contact hole of an insulating layer of a semiconductor device, comprising:
    a metal silicide layer formed on a bottom part of the contact hole;
    a manganese oxide layer formed on the metal silicide layer in the contact hole; and
    a buried copper formed on the manganese oxide layer, the buried copper substantially filling the contact hole, wherein the manganese oxide layer includes:
  a first manganese oxide layer which is an amorphous layer including silicon and is formed on the metal silicide layer; and
  a second manganese oxide layer which is a mixture of amorphous and nanocrystals and is formed on the first manganese oxide layer.

2. The contact plug structure of claim 1, further comprising:
  an oxide layer on the metal silicide layer.

3. The contact plug structure of claim 1, wherein the manganese oxide layer is formed on a sidewall of the contact hole.

4. The contact plug structure of claim 1, wherein the manganese oxide layer is amorphous.

5. The contact plug structure of claim 4, wherein the manganese oxide layer includes silicon (Si).

6. The contact plug structure of claim 5, wherein binding energy of manganese (Mn) in the manganese oxide layer increases from an interface between the buried copper and the manganese oxide layer toward an opposite interface of the manganese oxide layer.

7. The contact plug structure of claim 1, wherein the manganese oxide layer has a thickness of not less than 0.5 nm and not more than 7 nm.

8. The contact plug structure of claim 1, wherein the metal silicide layer includes a metal element selected from the group consisting of cobalt (Co), titanium (Ti), nickel (Ni) and tungsten (W).

9. The contact plug structure of claim 8, wherein the metal element comprises nickel (Ni).

10. The contact plug structure of claim 8, wherein the metal element comprises cobalt (Co).

11. A semiconductor device including the contact plug structure of claim 1.

12. The contact plug structure of claim 1, wherein an atomic concentration of metal in the metal silicide layer decreases toward an interface with the manganese oxide layer.

13. The contact plug structure of claim 1, wherein a manganese (Mn) valence number in the first manganese oxide layer differs from a manganese (Mn) valence number in the second manganese oxide layer.

14. The contact plug structure of claim 1, wherein the first manganese oxide layer has a manganese (Mn) valence number of +3.

15. The contact plug structure of claim 1, wherein the first manganese oxide layer has a manganese (Mn) valence number of +2.

16. The contact plug structure of claim 1, wherein an atomic concentration of silicon (Si) in the first manganese oxide layer is higher than an atomic concentration of silicon (Si) in the second manganese oxide layer.

17. The contact plug structure of claim 1, wherein a thickness of the first manganese oxide layer is equal to or more than a thickness of the second manganese oxide layer.

18. The contact plug structure of claim 1, wherein a total thickness of the first manganese oxide layer and the second manganese oxide layer is not more than 7 nm.

19. A method for forming a contact plug at a contact hole of an insulating layer in a semiconductor device, the method comprising the steps of;
  forming a metal silicide layer on a bottom surface of the contact hole of the insulating layer;
  forming a manganese oxide layer on the metal silicide layer; and
  forming a buried copper on the manganese oxide layer to provide a contact plug structure of claim 1.

20. The method as recited in claim 19, wherein the step of forming the manganese oxide layer includes the steps of
  forming a manganese layer, and
  oxidizing the manganese layer.

21. The method as recited in claim 19 further comprising:
  oxidizing a surface of the metal silicide layer, thereby forming an oxide layer including an element which constitutes the metal silicide layer.

22. The method as recited in claim 21, wherein the oxidizing step is performed by exposing the surface of the metal silicide to oxygen plasma.

23. The method as recited in claim 19, wherein the step of forming the manganese oxide layer includes the steps of:
  forming a first manganese oxide layer on the metal silicide layer, wherein the first manganese oxide layer is amorphous and includes silicon; and
  forming a second manganese oxide layer on the first manganese oxide layer, wherein the second manganese oxide layer is a mixture of amorphous and microcrystals.

24. The method as recited in claim 19 further comprising:
  oxidizing a surface of the metal silicide layer, thereby forming a silicon oxide layer.

25. A method for forming a contact plug at a contact hole of an insulating layer in a semiconductor device, the method comprising the steps of:
  forming a metal silicide layer on a bottom surface of the contact hole of the insulating layer;
  forming a copper-manganese alloy layer on the metal silicide layer,
  wherein the copper-manganese alloy layer fills substantially the contact hole of the insulating layer; and
  applying a heat treatment process so as to form a manganese oxide layer,
  wherein the heat treatment process includes diffusing manganese in the copper-manganese alloy layer toward an interface with the metal silicide layer to change a part of the copper-manganese alloy layer into a copper layer to provide a contact plug structure of claim 1.

26. The method as recited in claim 25, wherein the manganese oxide layer includes:
  a first manganese oxide layer formed on the metal silicide layer, wherein the first manganese oxide layer is amorphous and includes silicon; and
  a second manganese oxide layer formed on the first manganese oxide layer, wherein the second manganese oxide layer is a mixture of amorphous and microcrystals.

27. A method for forming a contact plug at a contact hole of an insulating layer in a semiconductor device, the method comprising the steps of:
  forming a metal silicide layer on a bottom surface of the contact hole of the insulating layer;
  forming a copper-manganese alloy layer on the metal silicide layer;
  forming a buried copper on the copper-manganese alloy layer; and
  applying a heat treatment process so as to form a manganese oxide layer,
  wherein the heat treatment process includes diffusing manganese in the copper-manganese alloy layer toward an interface with the metal silicide layer to change a part of the copper-manganese alloy layer into a copper layer which unifies with the buried copper to provide a contact plug structure of claim 1.

28. The method as recited in claim 27, wherein the manganese oxide layer includes:
- a first manganese oxide layer formed on the metal silicide layer, wherein the first manganese oxide layer is amorphous and includes silicon; and
- a second manganese oxide layer formed on the first manganese oxide layer, wherein the second manganese oxide layer is a mixture of amorphous and nanocrystals.

29. A method for forming a contact plug at a contact hole of an insulating layer in a semiconductor device, the method comprising the steps of:
- forming a metal silicide layer on a bottom surface of the contact hole of the insulating layer;
- forming a copper-manganese alloy layer on the metal silicide layer; and
- conducting a heat treatment in an atmosphere including oxygen at a temperature of not less than 150° C. and not more than 550° C. to provide a contact plug structure of claim 1.

30. A method of forming a contact plug at a contact hole of an insulating layer in a semiconductor device, the method comprising the steps of:
- forming a metal silicide layer on a bottom surface of the contact hole of an insulating layer;
- forming a copper-manganese alloy layer on the metal silicide layer; and
- conducting a heat treatment in an atmosphere including oxygen at a temperature of not less than 450° C. and not more than 550° C. to provide a contact plug structure of claim 1.

* * * * *